(12) United States Patent
Wang et al.

(10) Patent No.: US 6,882,572 B2
(45) Date of Patent: Apr. 19, 2005

(54) METHOD OF OPERATING A SEMICONDUCTOR MEMORY ARRAY OF FLOATING GATE MEMORY CELLS WITH HORIZONTALLY ORIENTED EDGES

(75) Inventors: Chih Hsin Wang, San Jose, CA (US); Bing Yeh, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/849,975

(22) Filed: May 19, 2004

(65) Prior Publication Data

US 2004/0212009 A1 Oct. 28, 2004

Related U.S. Application Data

(62) Division of application No. 10/183,834, filed on Jun. 25, 2002, now Pat. No. 6,756,633.
(60) Provisional application No. 60/355,363, filed on Feb. 6, 2002, and provisional application No. 60/343,634, filed on Dec. 27, 2001.

(51) Int. Cl.[7] .......................... G11C 16/04; G11C 16/06; H11L 29/788
(52) U.S. Cl. ..................... 365/185.18; 365/28; 257/315
(58) Field of Search ...................... 365/185.05, 185.14, 365/185.18, 185.26, 185.28; 257/315, 316, 317

(56) References Cited

U.S. PATENT DOCUMENTS

| 4,757,360 | A | 7/1988 | Farone |
| 4,794,565 | A | 12/1988 | Wu et al. |
| 4,882,707 | A | 11/1989 | Mizutani |
| 4,905,062 | A | 2/1990 | Esquivel et al. |
| 4,931,847 | A | 6/1990 | Corda |
| 4,947,221 | A | 8/1990 | Stewart et al. |
| 5,021,848 | A | 6/1991 | Chiu |
| 5,029,130 | A | 7/1991 | Yeh |
| 5,041,886 | A | 8/1991 | Lee |
| 5,101,250 | A | 3/1992 | Arima et al. |
| 5,268,319 | A | 12/1993 | Harari |
| 5,429,965 | A | 7/1995 | Shimoji |
| 5,455,792 | A | * 10/1995 | Yi .......................... 365/185.14 |
| 5,544,103 | A | 8/1996 | Lambertson |
| 5,572,054 | A | 11/1996 | Wang et al. |
| 5,780,341 | A | 7/1998 | Ogura |
| 5,780,892 | A | 7/1998 | Chen |
| 5,789,293 | A | 8/1998 | Cho et al. |
| 5,796,139 | A | 8/1998 | Fukase |
| 5,808,328 | A | 9/1998 | Nishizawa |

(Continued)

FOREIGN PATENT DOCUMENTS

EP    0 389 721 A2    10/1990

OTHER PUBLICATIONS

Hayashi, Fumihiko and Plummer, James D., "A SelfAligned Split–Gate Flash EEPROM Cell With 3–D Pillar Structure", 1999 Symposium on VLSI Technology Digest of Technical Papers, Center for Integrated System, Stanford University, Stanford, CA 94305, USA, pp. 87–88.

Primary Examiner—Trong Phan
(74) Attorney, Agent, or Firm—DLA Piper Rudnick Gray Cary US LLP

(57) ABSTRACT

A self aligned method of forming an array of floating gate memory cells, and an array formed thereby, wherein each memory cell includes a trench formed into a surface of a semiconductor substrate, and spaced apart source and drain regions with a channel region formed therebetween. The drain region is formed underneath the trench. An electrically conductive floating gate is formed over and insulated from a portion of the channel region, with a horizontally oriented edge extending therefrom. An electrically conductive control gate is formed having a first portion disposed in the trench and a second portion disposed adjacent to and insulated from the floating gate edge.

3 Claims, 31 Drawing Sheets

U.S. PATENT DOCUMENTS

| | | | |
|---|---|---|---|
| 5,811,853 A | 9/1998 | Wang | |
| 5,814,853 A | 9/1998 | Chen | |
| 6,088,263 A * | 7/2000 | Liu et al. | 365/185.05 |
| 6,091,104 A | 7/2000 | Chen | |
| 6,103,573 A | 8/2000 | Harari et al. | |
| 6,134,144 A * | 10/2000 | Lin et al. | 365/185.14 |
| 6,140,182 A | 10/2000 | Chen | |
| 6,222,227 B1 | 4/2001 | Chen | |
| 6,262,917 B1 | 7/2001 | Lee | |
| 6,426,896 B1 * | 7/2002 | Chen | 365/185.28 |

* cited by examiner

US 6,882,572 B2

METHOD OF OPERATING A SEMICONDUCTOR MEMORY ARRAY OF FLOATING GATE MEMORY CELLS WITH HORIZONTALLY ORIENTED EDGES

This application is a divisional of the U.S. application Ser. No. 10/183,834, filed on Jun. 25, 2002, which is now U.S. Pat. No. 6,756,633.

This application claims the benefit of U.S. Provisional Application No. 60/343,634, filed Dec. 27, 2001, and entitled A Super Self-Aligned Flash E2PROM With Vertical Word-Line Transistor For Program and Horizontal-Oriented Floating-Gate Tips For Erase and of U.S. Provisional Application No. 60/355,363, filed Feb. 6, 2002, and entitled A Super Self-Aligned Flash E2PROM With Vertical Word-Line Transistor For Program and Horizontal-Oriented Floating-Gate Tips For Erase—SAC Option and Metal Source-Line Option.

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing (which strongly depends upon lithography generation), contact alignment and contact integrity. In addition, significant space is reserved for the word-line transistor, the size of which is set by lithography generation and junction scaling.

Another aspect addressed by the present invention involves the erase performance of the memory cell. FIG. 1 illustrates a well known non-volatile memory cell design, which includes a floating gate 1 disposed over and insulated from a semiconductor substrate 2 having source and drain regions 3/4. A control gate 5 has a first portion that is disposed laterally adjacent to the floating gate 1, and a second portion that is disposed vertically over and overlapping the floating gate 1. The floating gate 1 includes a relatively sharp edge 6 that extends upwardly toward the control gate second portion. The edge 6 extending toward the overlapping portion of the control gate 5 enhances Fowler-Nordheim tunneling used to erase the memory cell. As the cell size is scaled down, at least some of the overlap between control gate 5 and floating gate 1 must be maintained so that the upwardly oriented pointed edges can be used for the erase function. This cell architecture imposes a scaling limit on the erase coupling ratio due to the finite overlap capacitance between the control gate 5 and the floating gate 1.

There is a need for a non-volatile, floating gate type memory cell array with significant cell size reduction without adversely compromising the erase coupling ratio of the memory cell.

SUMMARY OF THE INVENTION

The present invention solves the above mentioned problems by providing a self aligned method of forming memory cells with reduced size, by minimizing the space needed for the bit-line connection and word-line transistor and eliminating the need for a vertical overlap between the control gate and floating gate, and a memory cell array formed thereby.

The present invention is an electrically programmable and erasable memory device that includes a substrate of semiconductor material of a first conductivity type, first and second spaced-apart regions formed in the substrate and having a second conductivity type with a channel region of the substrate defined therebetween, an electrically conductive floating gate disposed over and insulated from at least a portion of the channel region, wherein the floating gate includes a horizontally oriented edge extending from a lateral side of the floating gate, and an electrically conductive control gate having at least a portion thereof disposed laterally adjacent to and insulated from the horizontally oriented edge.

In another aspect of the present invention, and array of electrically programmable and erasable memory devices includes a substrate of semiconductor material of a first conductivity type, and spaced apart isolation regions formed on the substrate which are generally parallel to one another and extend in a first direction, with an active region between each pair of adjacent isolation regions. Each of the active regions includes a plurality of memory cells, where each of the memory cells includes first and second spaced-apart regions formed in the substrate having a second conductivity type with a channel region of the substrate defined therebetween, an electrically conductive floating gate disposed over and insulated from at least a portion of the channel region wherein the floating gate includes a horizontally oriented edge extending from a lateral side of the floating gate, and an electrically conductive control gate having at least a portion thereof disposed laterally adjacent to and insulated from the horizontally oriented edge.

In yet another aspect of the present invention, a method of forming a semiconductor memory cell includes the steps of forming first and second spaced apart regions in a semiconductor substrate having a conductivity type different from that of the substrate, wherein a channel region of the substrate is defined between the first and second regions, forming a floating gate of electrically conductive material disposed over and insulated from at least a portion of the channel region, wherein the floating gate includes a horizontally oriented edge extending from a lateral side of the floating gate, and forming a control gate of electrically conductive material having at least a portion thereof disposed laterally adjacent to and insulated from the horizontally oriented edge.

In still yet another aspect of the present invention, a method of forming an array of semiconductor memory cells includes the steps of forming spaced apart isolation regions on the substrate having a first conductivity type which are generally parallel to one another and extend in a first direction, with an active region between each pair of adjacent isolation regions, forming a plurality of spaced apart first and second regions in the semiconductor substrate having a second conductivity type, wherein a plurality of channel regions in the active regions of the substrate are defined each extending between one of the first regions and one of the second regions, forming a plurality of floating gates of electrically conductive material each disposed over and insulated from at least a portion of one of the channel regions, wherein each of the floating gates includes a horizontally oriented edge extending from a lateral side of the floating gate, and forming a plurality of electrically conductive control gates each having at least a portion thereof disposed laterally adjacent to and insulated from one of the horizontally oriented edges.

In even another aspect of present invention, a method of operating an electrically programmable and erasable memory device having an electrically conductive floating gate disposed over and insulated from a substrate of semiconductor material, and an electrically conductive control gate having at least a portion thereof disposed laterally adjacent to the floating gate and insulated therefrom by an insulating material, includes the step of placing a voltage on the control gate that is sufficiently positive relative to a voltage of the floating gate to induce electrons on the floating gate to laterally tunnel from a horizontally oriented edge extending from a lateral side of the floating gate, through the insulating material, and onto the control gate via Fowler-Nordheim tunneling.

And in one more aspect of the present invention, a method of operating an electrically programmable and erasable non-volatile memory cell having a first and a second state, and including an electrically conductive floating gate disposed over and insulated from a substrate of semiconductor material, and an electrically conductive control gate having at least a portion thereof disposed laterally adjacent to the floating gate, includes the steps of establishing a first state of the memory cell by injecting electrons from a drain region of the substrate onto the floating gate, wherein the source region is disposed below a surface of the substrate and the injected electrons travel through the substrate in a direction generally perpendicular to the surface of the substrate, and establishing a second state of the memory cell by removing electrons from the floating gate to the control gate via Fowler-Nordheim tunneling through an insulating material disposed therebetween, wherein the removed electrons tunnel from a horizontally oriented edge extending from a lateral side of the floating gate, through the insulating material, and onto the control gate in a direction generally parallel to the surface of the substrate.

Other objects and features of the present invention will become apparent by a review of the specification, claims and appended figures.

DETAILED DESCRIPTION OF THE PREFERRED EMBODIMENTS

The present invention is a method of forming columns of non-volatile memory cells in active regions that are separated by isolations regions, and an array of memory cells formed thereby. The memory cells utilize a unique memory cell design that allows significant cell size reduction without adversely compromising the erase coupling ratio of the memory cell.

Isolation Region Formation

Figure 2A:
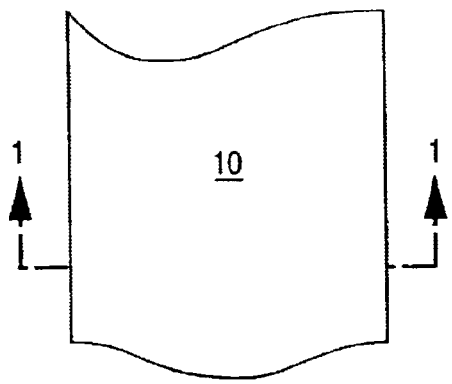
FIG. 2A is a top view of a semiconductor substrate used in the first step of the method of present invention to form isolation regions.
Figure 2B:
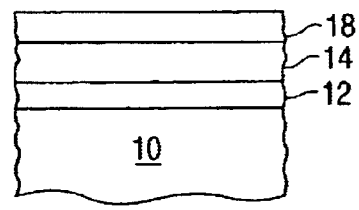
FIG. 2B is a cross sectional view of the structure taken along the line 1—1 showing the initial processing steps of the present invention.

Referring to FIG. 2A there is shown a top plan view of a semiconductor substrate 10 (or a semiconductor well), which is preferably of P type and is well known in the art. A layer of insulating material 12, such as silicon dioxide (hereinafter "oxide"), is deposited thereon as shown in FIG. 2B. The insulating layer 12 is formed on the substrate 10 by well known techniques such as oxidation or deposition (e.g. chemical vapor deposition or CVD), forming a layer of oxide preferably 80 Å thick. A layer of polysilicon 14 (hereinafter "poly") is deposited on top of the layer of insulating material 12 (e.g. 200 to 700 Å thick). The deposition and formation of the polysilicon layer 14 on the insulating layer 12 can be made by a well known process such as Low Pressure CVD or LPCVD. This poly layer 14 can be doped by ion implantation or in-Situ doped. A silicon nitride layer 18 (hereinafter "nitride") is deposited over the polysilicon layer 14, preferably by CVD (e.g. 500–1000 Å thick). This nitride layer 18 is used to define the active regions during isolation formation. Of course, all of the forgoing described parameters and the parameters described hereinafter, depend upon the design rules and the process technology generation. What is described herein is for a 0.13 micron process. However, it will be understood by those skilled in the art that the present invention is not limited to any specific process technology generation, nor to any specific value in any of the process parameters described hereinafter.

Figure 2C:
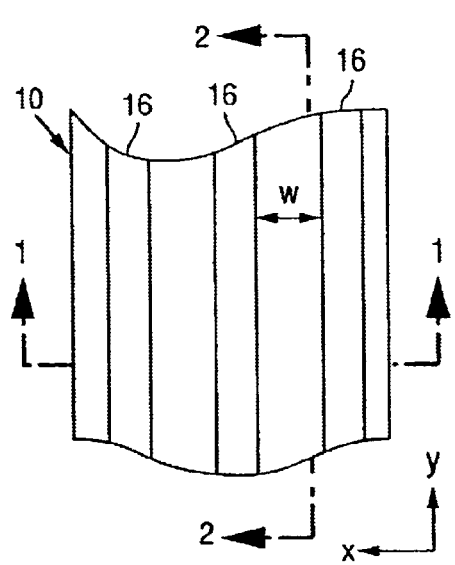
FIG. 2C is a top view of the structure showing the next step in the processing of the structure of FIG. 2B, in which isolation regions are formed.
Figure 2D:
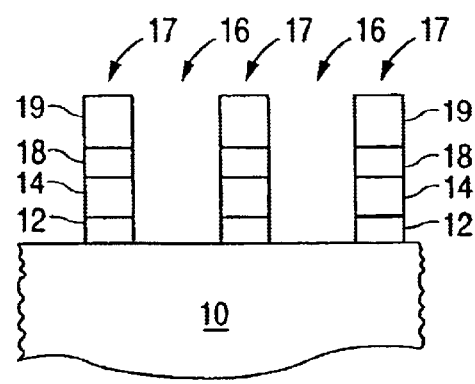
FIG. 2D is a cross sectional view of the structure in FIG. 2C taken along the line 1—1 showing the isolation stripes formed in the structure.

Once the insulating layer 12, the polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulating material 12 are etched away in stripes 16 formed in the Y or column direction, as shown in FIG. 2C, using standard etching techniques (i.e. anisotropic etch processes). The distance W between adjacent stripes 16 can be as small as the smallest lithographic feature of the process used. Where the photo resist 19 is not removed, the silicon nitride 18, the polysilicon region 14 and the underlying insulating region 12 are maintained. The resulting structure is illustrated in FIG. 2D, with active regions 17 interlaced with isolation regions 16. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing (CMP) etch). It should be noted that during the LOCOS formation, a spacer may be necessary to protect the side walls of poly layer 14 during the formation of the local field oxide.

Figure 2E:
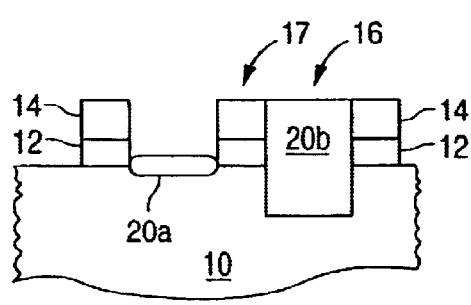
FIG. 2E is a cross sectional view of the structure in FIG. 2C taken along the line 1—1 showing the two types of isolation regions that can be formed in the semiconductor substrate: LOCOS or shallow trench.

The remaining polysilicon layer 14 and the underlying insulating material 12 form the active regions. Thus, at this point, the substrate 10 has alternating stripes of active regions and isolation regions with the isolation regions being formed of either LOCOS insulating material 20a or shallow trench insulating material 20b. Although FIG. 2E shows the formation of both a LOCOS region 20a and a shallow trench region 20b, only one of the LOCOS process (20a) or the shallow trench process (20b) will be used. In the preferred embodiment, the shallow trench of insulating material 20b will be formed, because it can be more precisely formed at smaller design rules. The structure in FIG. 2E represents a self aligned structure, which is more compact than a structure formed by a non self-aligned method.

A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and the layer of silicon dioxide 12 (to form the gate oxide) is deposited over the substrate 10. The layer of polysilicon 14 is deposited over the gate oxide 12. The layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18. The memory array of the present invention can be made by either the self-aligned process or the non self-aligned process.

Memory Array Formation

Figure 3A:
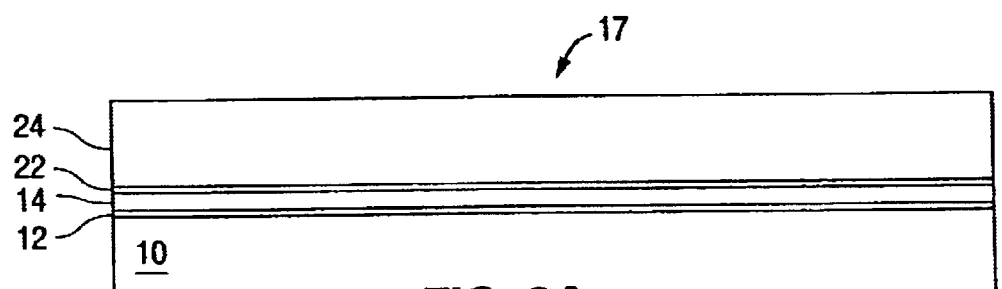
FIGS. 3A–3U are cross sectional views taken along the line 2—2 of FIG. 2C showing in sequence the next step(s) in the processing of the structure shown in FIG. 2C, in the formation of a non volatile memory array of floating memory cells according to the present invention.
Figure 3B:
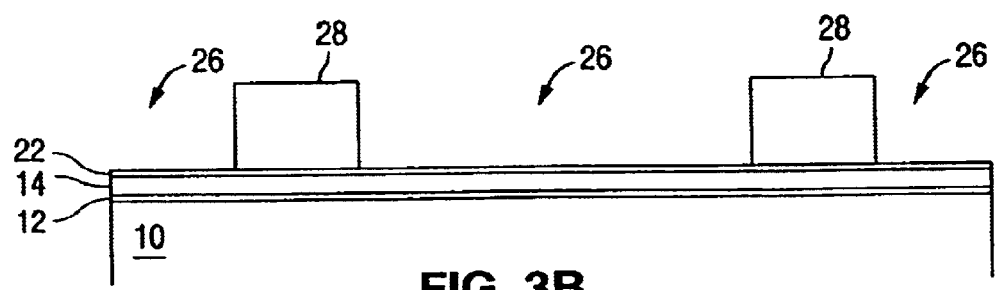

With the structure shown in FIG. 2E made using either the self aligned method or the non self-aligned method, the structure is further processed as follows. FIGS. 3A to 3U show the cross section of the active region structure 17 from a view orthogonal to that of FIGS. 2B and 2E, as the next steps in the process of the present invention are performed. It should be appreciated that while only a small segment of active region 17 is shown, the processing steps illustrated below form an array of such regions.

An insulating layer 22 is first formed on the structure. Specifically, an oxide layer 22 is formed over poly layer 14 (e.g. 100 to 200 Å thick). A thick poly layer 24 is then formed over the oxide layer 22 (e.g. ~3000 Å thick). The resulting active region structure is shown in FIG. 3A.

A conventional photo-lithography (masking) scheme is next used to form semi-recessed first trenches 26 in the structure in the following manner. A suitable photo-resistant material is applied on the poly layer 24 and a masking step is performed to selectively remove the photo-resistant material from selected parallel stripe regions (under which the first trenches 26 will be formed). Where the photo-resist material is removed, the exposed polysilicon 24 is removed using a standard poly etch process (e.g. anisotropic poly etch using oxide layer 22 as an etch stop), leaving blocks of polysilicon 28 with first trenches 26 formed therebetween. The width of poly blocks 28 can be as small as the smallest lithographic feature of the process used. The remaining photo resist is removed, resulting in the structure illustrated in FIG. 3B.

Figure 3C:
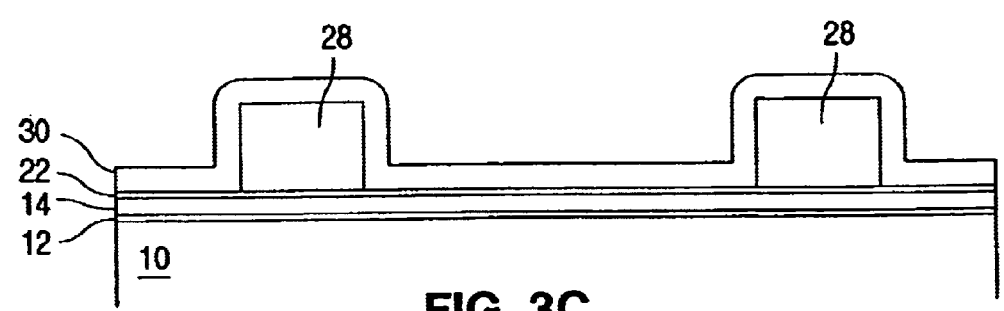
Figure 3D:
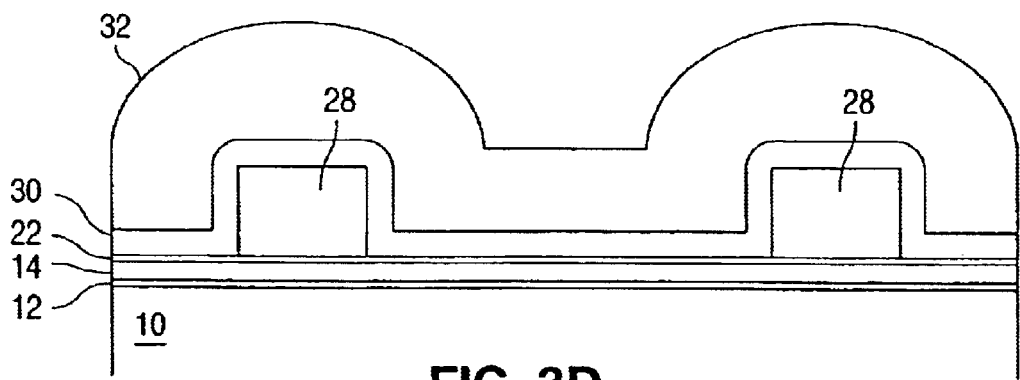
Figure 3E:
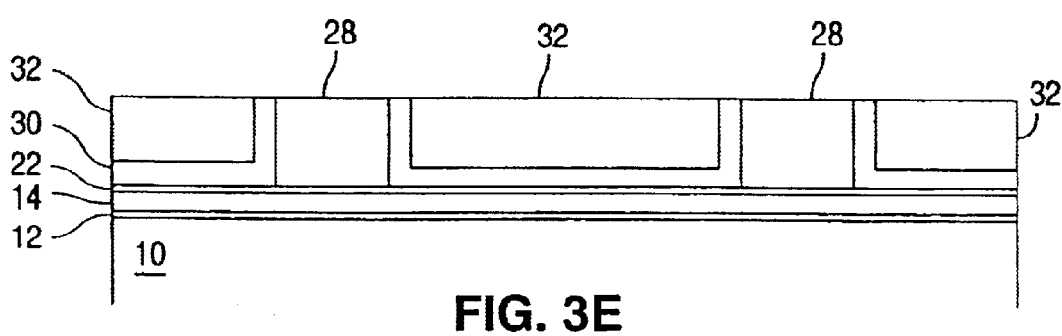

A nitride deposition step is used to form a nitride layer 30 (e.g. 300 to 500 Å thick) over the structure, as illustrated in FIG. 3C. A thick oxide layer 32 (e.g. 2500 Å thick) is then deposited over nitride layer 30, as illustrated in FIG. 3D. A planarization etch process follows (e.g. Chemical-Mechanical-Polishing (CMP) etch), which etches the thick oxide layer 32 down even with the tops of poly blocks 28 (using poly blocks 28 as the polishing stopper). The CMP etch also removes the portions of nitride layer 30 over poly blocks 28. The resulting structure is shown in FIG. 3E.

Figure 3F:
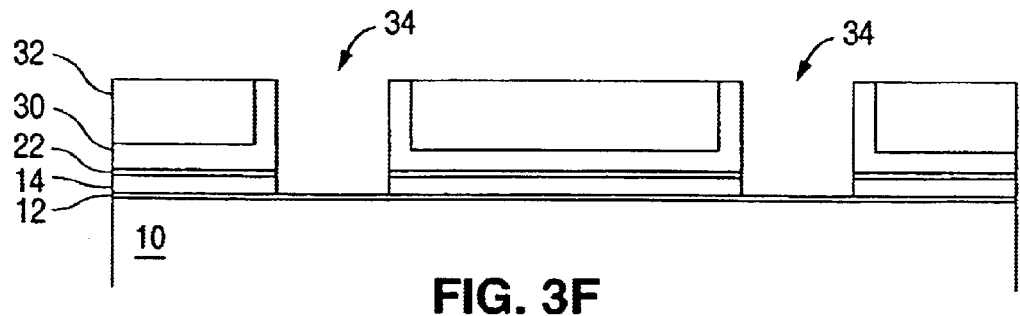

A poly etch process is used to remove poly blocks 28 (using oxide layer 22 as an etch stop) to form second trenches 34. A controlled oxide etch is used to remove the portions of oxide layer 22 exposed at the bottoms of second trenches 34 (using poly layer 14 as an etch stop). This oxide etch also consumes some of thick oxide layer 32. Another poly etch process is performed to remove portions of poly layer 14 exposed at the bottoms of the second trenches 34 (using oxide layer 12 as an etch stop). The resulting structure is shown in FIG. 3F.

Figure 3G:
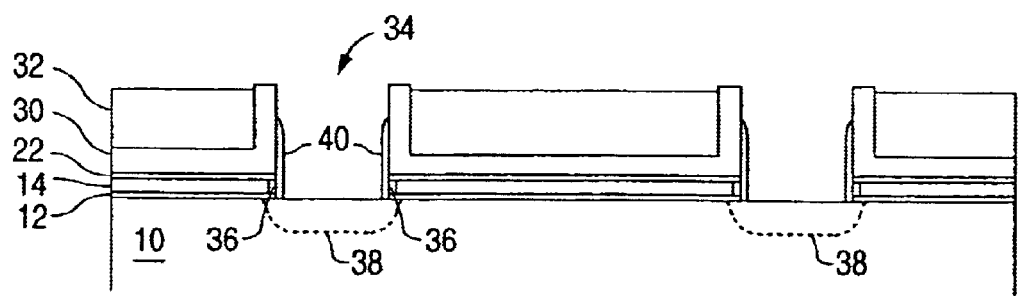

An oxide sidewall layer 36 is formed on the exposed ends of poly layer 14 at trenches 34 using a thermal oxidation process. Suitable ion implantation is then made across the entire surface of the structure. Where the ions have sufficient energy to penetrate exposed portions of oxide layer 12 in each second trench 34, they then form first regions (source regions) 38 in the substrate 10 having a conductivity type (e.g. N type) that is different from that of the surrounding substrate (e.g. P type). In all other regions, the ions are absorbed by the underlying structure, where they have no effect. The implanted source regions 38 are self aligned to the second trenches 34. Sidewall spacers 40 are then formed against the walls of the second trenches 34. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 40 can be formed of any dielectric material with good etch selectivity to nitride layer 30 and to substrate silicon 10. In the preferred embodiment, insulating spacers 40 are formed of oxide by depositing a thin layer of oxide (e.g. 200 Å) over the entire structure, followed by an anisotropic etch process, such as the well known Reactive Ion Etch (RIE dry etch), to remove the deposited oxide layer except for spacers 40. This oxide etch process also removes the exposed portions of oxide layer 12 at the bottom of second trenches 34 to expose the substrate 10, as well as some of oxide layer 32. The resulting structure is shown in FIG. 3G.

Figure 3H:
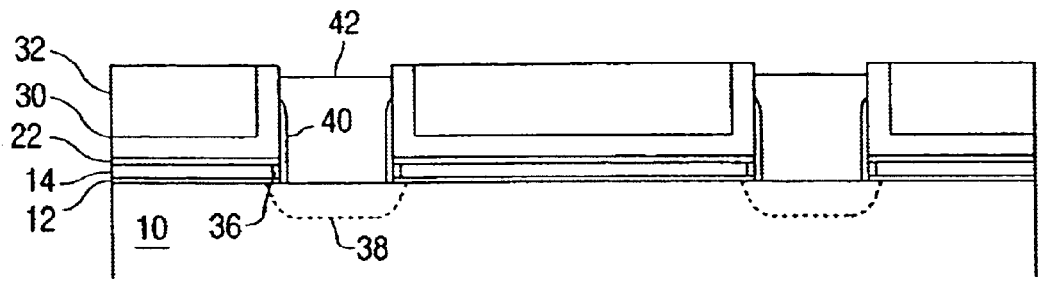

The second trenches are filled with poly blocks 42, preferably in the following manner. A thick layer of poly silicon is deposited over the structure. A planarization process (i.e. CMP) is used to remove the deposited poly silicon except for poly blocks 42 in second trenches 34. An optional poly etch may be performed to slightly recess the upper surfaces of poly blocks 34 relative to nitride layer 30 and oxide layer 32, to address any topography issues, if present, that can unintentionally short poly blocks 42 to one another. The poly blocks 42 run across the array columns (along line 1—1 in FIG. 2C) and are in direct electrical contact with source regions 38 of substrate 10. The resulting structure is shown in FIG. 3H.

Figure 3I:
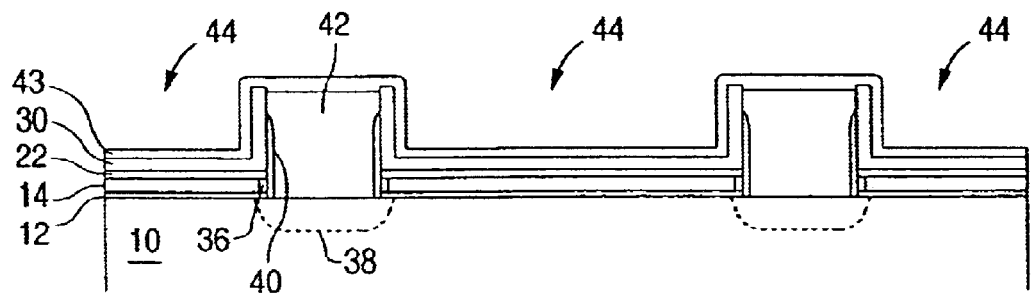
Figure 3J:
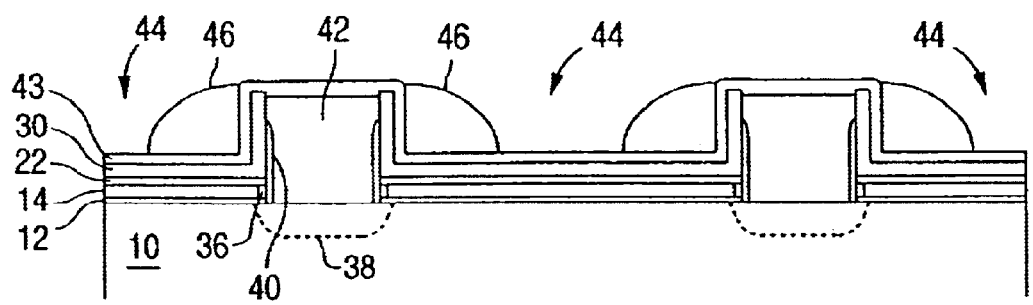

An oxide etch is used to remove oxide layer 32, leaving semi-recessed third trenches 44 disposed between poly blocks 42. An oxide layer 43 is then formed over the structure (e.g. 200–300 Å) by conventional techniques (e.g. LPCVD). The resulting structure is illustrated in FIG. 3I. Nitride spacers 46 are formed against the sidewalls of third trenches 44 by depositing a thick layer of nitride (e.g. 2000 Å), followed by an anisotropic nitride (RIE dry) etch to remove the deposited nitride except for spacers 46 (e.g. spacers having a width of ~1500 Å). The resulting structure is shown in FIG. 3J.

Figure 3K:
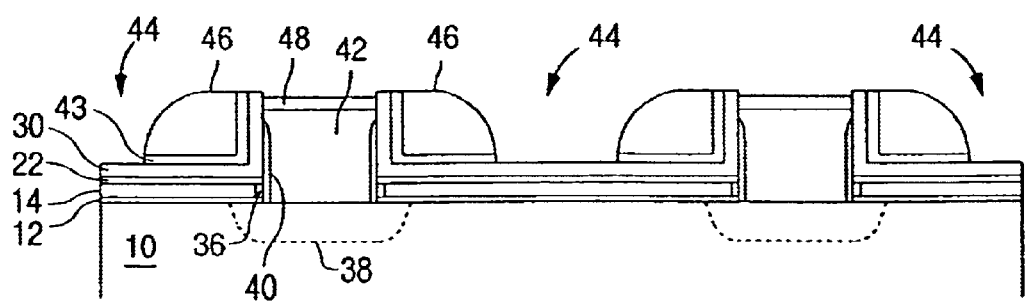

An oxide etch is next used to remove the exposed portions of oxide layer 43 (i.e. those portions not protected by spacers 46). The structure is then subjected to a thermal oxidation process, which forms an oxide layer 48 over poly blocks 42. Oxide layer 48 is self aligned to the poly blocks 42 (with a thickness, for example, of ~600 Å). During the thermal cycle of this oxidation process, the source regions 38 are driven deeper into the substrate. The resulting structure is shown in FIG. 3K.

Figure 3L:
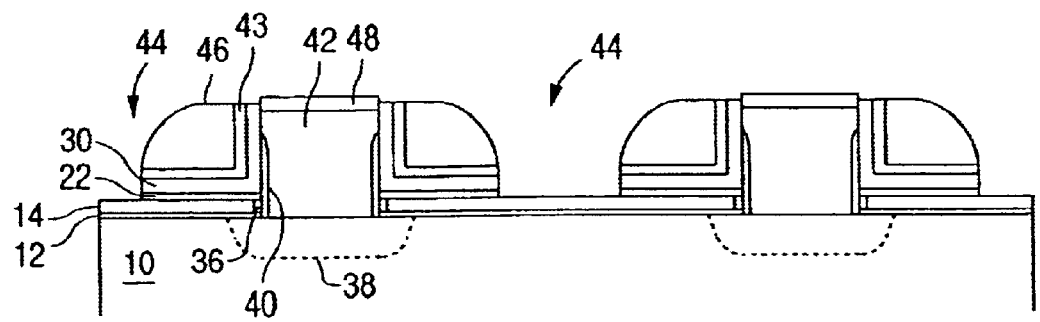

An anisotropic (dry) nitride etch is used to remove the portions of nitride layer 30 that are exposed in third trenches (between nitride spacers 46), using oxide layer 22 as an etch stop. This nitride etch also removes some of the exposed portions of nitride layer 30 adjacent poly blocks 42 and spacers 46. An anisotropic oxide etch follows to remove the portions of oxide layer 22 that are exposed in third trenches 44 (between nitride spacers 46), using poly layer 14 as an etch stop. This oxide etch also slightly consumes small portions of oxide layer 48. The resulting structure is shown in FIG. 3L.

Figure 3M:
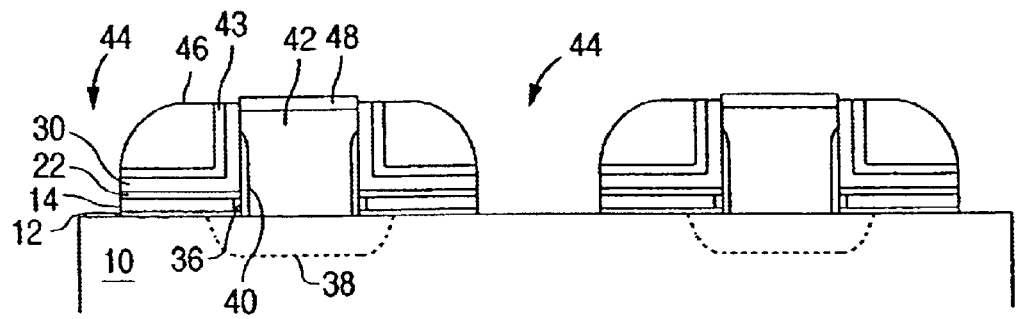

An anisotropic (dry) poly etch is next performed to remove the portions of poly layer 14 that are exposed in third trenches (between nitride spacers 46), using oxide layer 12 as an etch stop. An anisotropic (dry) oxide etch follows, which removes the portions of oxide layer 12 that are exposed in third trenches (between nitride spacers 46), which exposes the substrate 10 at the bottom of third trenches 44. This oxide etch also slightly consumes small portions of oxide layer 48. The resulting structure is shown in FIG. 3M.

Figure 3N:
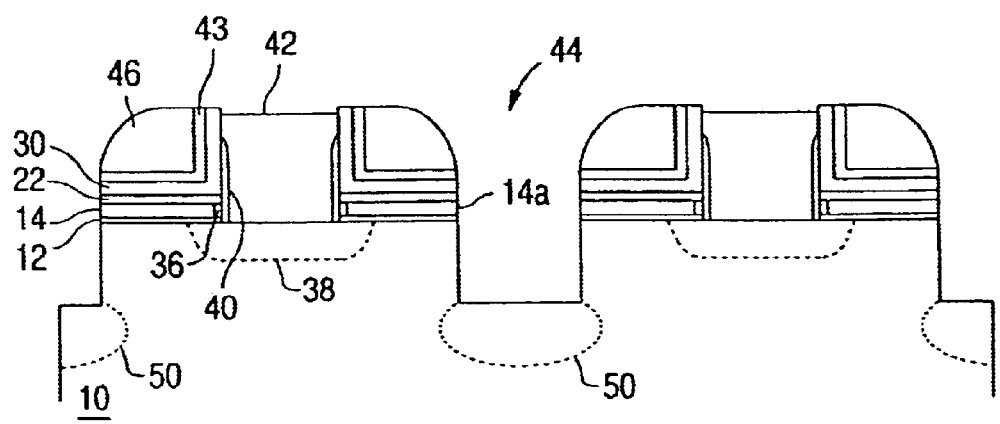

Next, with the silicon substrate 10 left exposed at the bottom of third trenches 44, a silicon etch process is performed to extend third trenches 44 down into substrate 10 (e.g. to a depth of 500 Å to 1500 Å below the substrate surface). Then, an oxide etch is used to remove oxide layer 48, and to etch the top of isolation oxide 20a or 20b (shown in FIG. 2E) down to a level generally equal to the bottom of trenches 44. Thus, third trenches 44 are continuously formed and extend across the active and isolation regions 17/16. Suitable ion implantation is once again made across the entire surface of the structure. The ion implantation forms second regions 50 (buried bit-line drain regions) in the active regions of substrate 10 underneath third trenches 44. The ion implant also has the effect of doping (or further doping) the exposed poly blocks 42. Outside of third trenches 44, and except for poly blocks 42, the ions are blocked and have no effect. The resulting structure is shown in FIG. 3N. The second regions 50 are not formed under the portions of third trenches that are in the isolation regions, because the ions are blocked by the isolation oxide 20a or 20b.

Figure 3O:
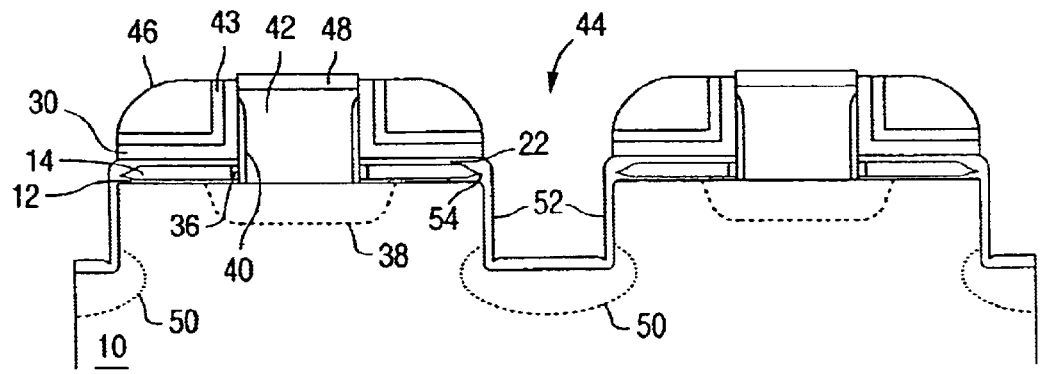

An oxidation process is then performed, which oxidizes the exposed silicon surfaces of third trenches 44 to form a thin layer of oxide 52 lining these silicon surfaces. This oxidation process also oxidizes the exposed lateral sides 14a of poly layer 14 that form part of the sidewalls of upper portions of third trenches 44, which results in horizontally oriented edges 54 each of which points directly toward one of the sidewalls of third trenches 44, as illustrated in FIG. 3O. Edges 54 can be elongated edges (i.e. like the sharp edge of a razor blade), or shorter edges (i.e. like the tip of a pencil). This oxidation process also re-grows the oxide layer 48 over poly blocks 42.

Figure 3P:
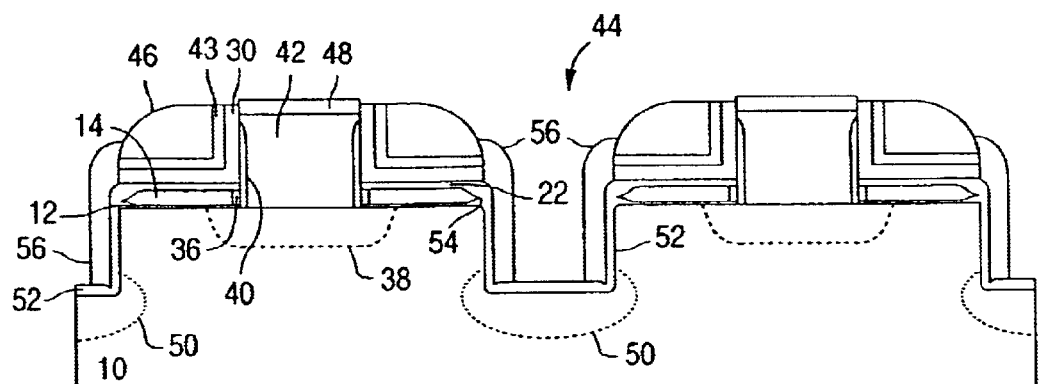

The formation of poly spacers 56 along sidewalls of third trenches 44 follows, which is done by first depositing a poly layer over the structure (e.g. 2000 Å thick). A dry anisotropic dry etch process is then used to remove the deposited poly layer, except for poly spacers 56 left along the sidewalls of third trenches 44. The resulting structure is shown in FIG. 3P.

Figure 3Q:
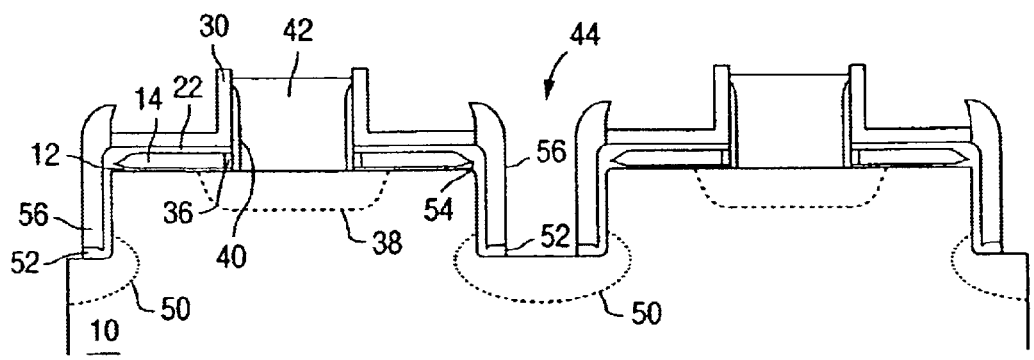
Figure 3R:
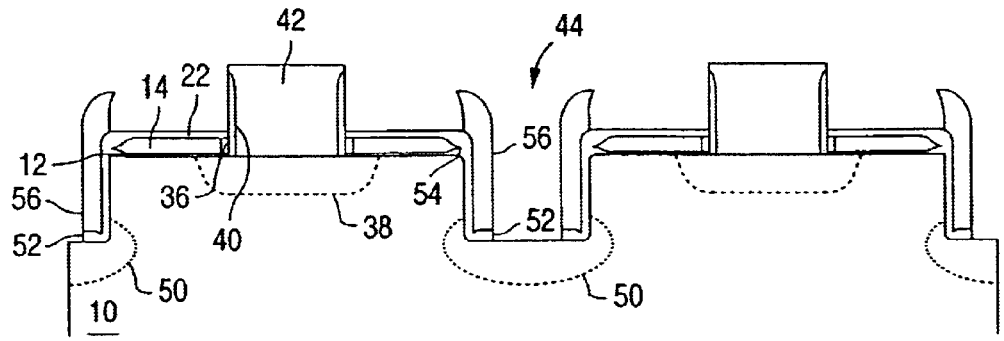
Figure 3S:
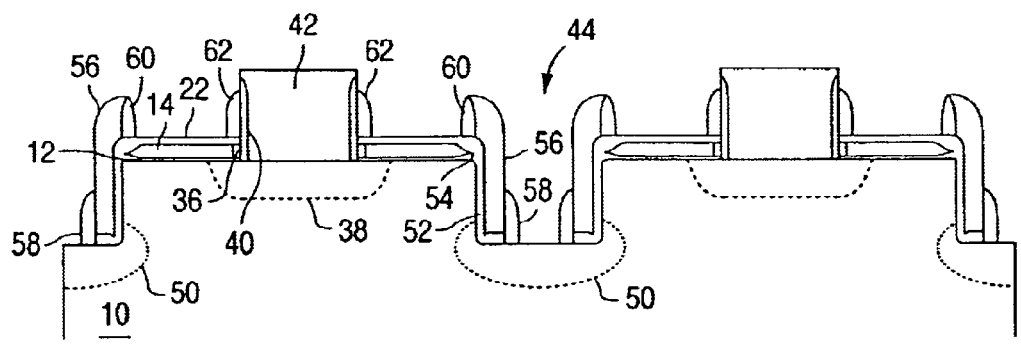

A nitride etch process is then used to remove nitride spacers 46. An oxide etch follows to remove oxide layers 48 and 43, and the exposed portions of oxide layer 52 at the bottom of third trenches 44 (in-between poly spacers 56), as shown in FIG. 3Q. A nitride etch process follows (e.g. in hot phosphoric acid), which removes nitride layer 30, as shown in FIG. 3R. Insulating spacers 58 (preferably oxide) are formed along the bottoms of the third trench sidewalls by depositing a layer of oxide over the structure (e.g. 500 to 1200 Å thick), followed by an oxide etch (e.g. RIE). This oxide deposition and etch process also forms oxide spacers 60 adjacent poly spacers 56 (over poly edges 54), and oxide spacers 62 adjacent oxide spacers 40. The resulting structure is shown in FIG. 3S.

Figure 3T:
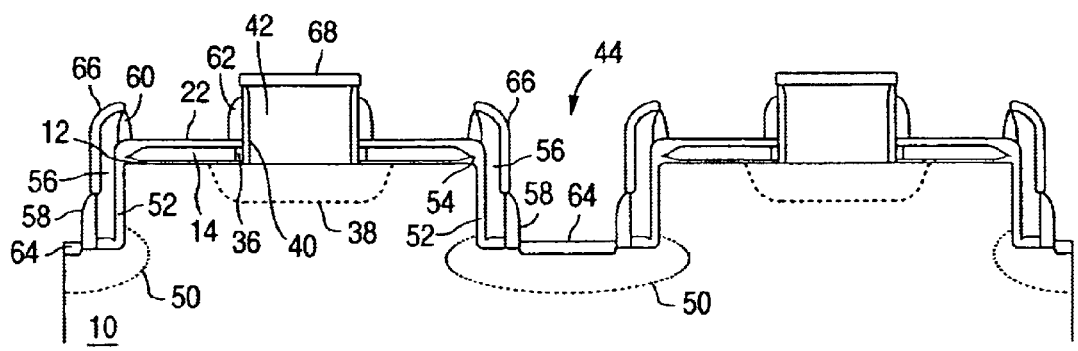
Figure 3U:
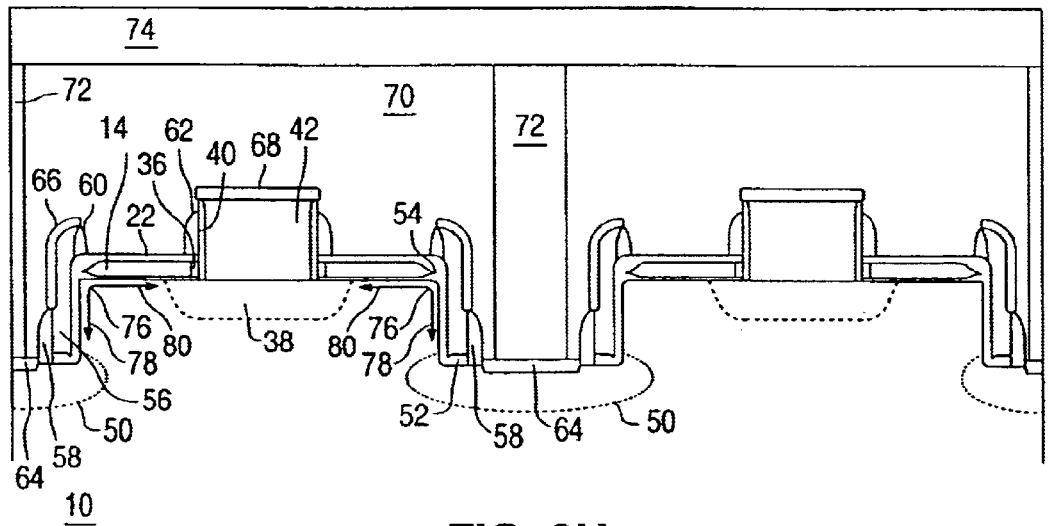

A metal deposition step is then performed, to deposit a metal such as tungsten, cobalt, titanium, nickel, platinum, or molybdenum over the structure. The structure is then annealed, permitting the hot metal to flow and to seep into the exposed portions of the substrate 10 at the bottom of third trenches 44 to form a conductive layer of metalized silicon 64 (silicide) between oxide spacers 58. Metalized silicon regions 64 on substrate 10 can be called self aligned silicide (i.e. salicide), because they are self aligned to the second regions 50 by spacers 58. The hot metal also forms a conductive layer of metalized polysilicon 66 (polycide) on the exposed top portions of poly spacers 56, and polycide layer 68 on the exposed top portions of poly blocks 42. The metal deposited on the remaining structure is removed by a metal etch process. The resulting structure is shown in FIG. 3T.

Passivation, such as BPSG 70, is used to cover the structure, including filling third trenches 44. A masking step is performed to define etching areas over the salicide regions 64. The BPSG 70 is selectively etched in the etching areas to create contact openings that are ideally centered over the salicide regions 64 (and second regions 50). The contact openings are then filled with conductor metal by metal deposition and planarizing etch-back, forming conductor contacts 72. The salicide layer 64 enhances conduction between the conductors 72 and the second regions 50. Polycide layers 66/68 enhance conduction along the length of poly spacers 56 and poly blocks 42. A bit line connector 74 is added to each active region by metal masking over the BPSG 70 to connect together all the contacts 72 in that active region. The final structure is shown in FIG. 3U.

As shown in FIG. 3U, first and second regions 38/50 form the source and drain for each cell (although those skilled in the art know that source and drain can be switched during operation). Poly layer 14 constitutes the floating gate and poly spacer 56 constitutes the control gate for each of the memory cells. A channel region 76 for each memory cell is the surface portion of the substrate that is in-between the source and drain 38/50. Each channel region 76 has two portions joined together at a right angle: a vertical portion 78 extending along the vertical wall of third trench 44, and a horizontal portion 80 extending between the third trench 44 and the source region 38. Each floating gate 14 is disposed over, but insulated from, the horizontal portion 80 of the channel region 76, and a portion of the source region 38. The floating gates 14 each have the horizontally oriented edge 54 that directly faces one of the control gates 56, but are insulated therefrom by oxide layer 52. The process of the present invention forms pairs of memory cells that mirror each other, with a memory cell formed on each side of the third trenches 44 that share a common bit-line region 50. Similarly, each source line region 38, which is in electrical contact with poly block 42, is shared between adjacent memory cells from different mirror sets of memory cells. Each control gate 56, source region 38 (with poly block 42 electrically connected thereto) and drain region 50 continuously extend across the isolation regions 16 and active regions 17, linking together one memory cell from each of the active regions 17.

Memory Cell Operation

The operation of the memory cells will now be described below with reference to FIG. 3U. The operation and theory of operation of such memory cells are also described in U.S. Pat. No. 5,572,054, whose disclosure is incorporated herein by reference with regard to the operation and theory of operation of erasing and reading a non-volatile memory cell having a floating gate and a control gate, floating gate to control gate tunneling, and an array of such memory cells.

To initially erase a selected memory cell in any given active region 17, a ground potential is applied to both its source 38 and drain 50. A high-positive voltage (e.g. +5–10 volts), is applied to the control gate 56. Electrons on the floating gate 14 are induced through the Fowler-Nordheim tunneling mechanism to tunnel through the oxide layer 52 to the control gate 56, leaving the floating gate 14 positively charged. Tunneling is enhanced by the horizontally oriented edge 54 formed on each floating gate 14. It should be noted that since each control gate 56 continuously extends across the active regions 17 and isolation regions 16, one memory cell from each active region is erased when the high voltage is applied to one of the control gates 56.

When a selected memory cell is desired to be programmed, a small voltage (e.g. 0.5 to 1.0 V) is applied to its drain region 50. A positive voltage level in the vicinity of the threshold voltage of the MOS structure defined by the control gate 56 (on the order of approximately +1.8 volts) is applied to its control gate 56. A positive high voltage, on the order of 9 or 10 volts, is applied to its source region 38. Electrons generated by the drain region 50 will flow from the drain region 50 towards the source region 38 through the weakly-inverted vertical portion 78 of the channel region 76. As the electrons reach the horizontal portion 80 of the channel region 76, they will see the high potential of the near end of floating gate 14 (because the floating gate 14 is more strongly capacitively coupled to the positively charged source region 38 than to the control gate 56). The electrons will accelerate and become heated, with most of them being injected into and through the insulating layer 12 and onto the floating gate 14. Ground potential and Vdd (approximately 1.5 to 3.3 volts depending upon the power supply voltage of the device) are applied to the source lines 38 and bit-line regions 50, respectively, for memory cell rows and columns not containing the selected memory cell. Ground potential is applied to the control gates 56 for memory cell rows not containing the selected memory cell. Thus, only the memory cell in the selected row and column is programmed.

The injection of electrons onto the floating gate 14 will continue until the reduction of the charge on the near end of the floating gate 14 can no longer sustain a high surface potential along the horizontal channel region portion 80 to generate hot electrons. At that point, the reduced charge on the floating gate 14 will decrease the electron flow from the drain region 50 onto the floating gate 14.

Finally, to read a selected memory cell, ground potential is applied to its source region 38. A read voltage of approximately +1 volt is applied to its drain region 50 and approximately 1.5 to 3.3 volts (depending upon the power supply voltage of the device) is applied to its control gate 56. If the floating gate 14 is positively charged (i.e. the floating gate is discharged of electrons), then the horizontal portion 80 of the channel region 76 (directly underneath the floating gate 14) is turned on. When the control gate 56 is raised to the read potential, the vertical portion 78 of the channel region 76 (directly adjacent the control gate 56) is also turned on. Thus, the entire channel region 76 will be turned on, causing electrical current to flow from the source region 38 to the drain region 50. This would be the "1" state.

On the other hand, if the floating gate 14 is negatively charged, the horizontal portion 80 of the channel region 76 (directly below the floating gate 14) is either weakly turned on or is entirely shut off. Even when the control gate 56 and the drain region 50 are raised to the read potential, little or no current will flow through horizontal portion 80 of channel region 76. In this case, either the current is very small compared to that of the "1" state or there is no current at all. In this manner, the memory cell is sensed to be programmed at the "0" state. Ground potential is applied to the source lines 38, bit-line regions 50, and control gates 56 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

Figure 1:
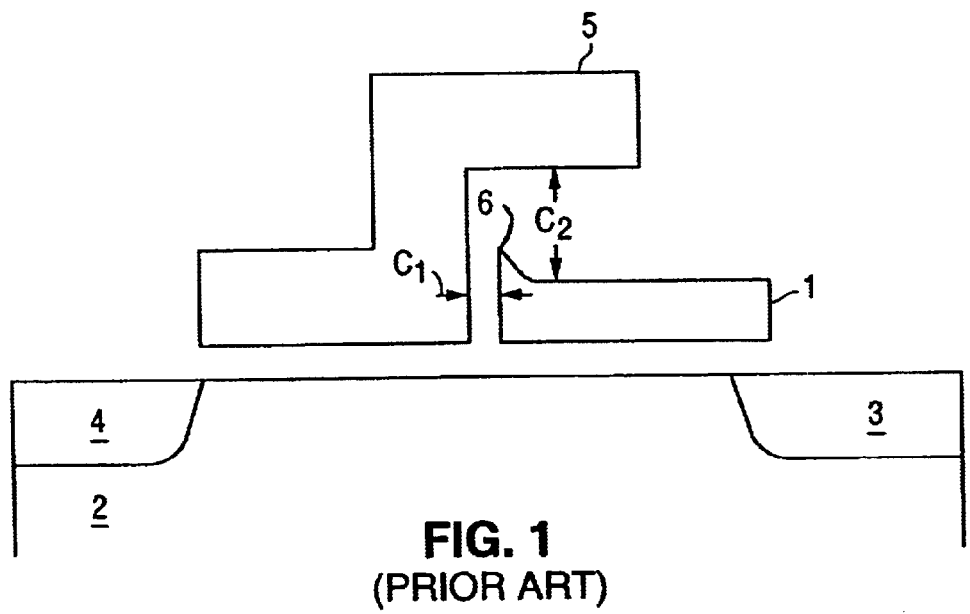
FIG. 1 is a side cross-sectional view showing a conventional split-gate non-volatile memory cell.

The memory cell architecture of the present invention is advantageous because it does not employ a finite, vertical overlap area between an upwardly extending edge of the floating gate and the control gate. As shown in the prior art configuration of FIG. 1, there is a first coupling capacitance $C_1$ laterally between the floating gate 1 and control gate 5, and a second coupling capacitance $C_2$ vertically between the floating gate 1 and control gate 5. The goal is to maximize tunneling efficiency while minimizing capacitive coupling between these two elements. $C_2$ can be minimized by reducing the amount of control gate 5 that overhangs floating gate 1. However, there is a constraint on minimizing $C_1$ as the floating gate will have a finite thickness due to fabrication process limitations. If the lateral distance between the floating and control gates is enlarged to reduce $C_1$, then the insulation material therebetween will be degraded by tunneling. If the lateral distance is narrowed to enhance tunneling, then capacitive coupling $C_1$ becomes large. Thus, capacitive coupling $C_1$ serves as a scaling limit.

With the present invention, however, this scaling limit is bypassed because the horizontally oriented edge 54 directly faces a vertically oriented control gate spacer 56 disposed laterally adjacent thereto. There is no vertically oriented capacitive coupling (e.g. $C_2$), and the laterally oriented capacitive coupling (e.g. $C_1$) can be sufficiently small while still allowing for adequate tunneling between the horizontally oriented edge 54 and control gate 56.

The present invention also provides a memory cell array with reduced size and superior program efficiency. Memory cell size is reduced by as much as 50% because the bit line region 50 is buried inside the substrate 10, and the bit line regions 50 are self aligned to the third trenches, where space is not wasted due to limitations in the lithography generation, contact alignment and contact integrity. Cell areas of approximately 0.21 $\mu$m and 0.14 $\mu$m can be achieved by the present invention using 0.18 $\mu$m and 0.13 $\mu$m technology generations, respectively. Program efficiency is greatly enhanced by "aiming" the vertical portion 78 of the channel region 76 at the floating gate 14. In conventional programming schemes, the electrons in the channel region flow in a path parallel to the floating gate, where a relatively small number of the electrons become heated and are injected onto the floating gate. The estimated program efficiency (number of electrons injected compared to total number of electrons) is estimated at about $\frac{1}{1000}$. However, because the first portion of the channel region defines an electron path that is 'aimed' directly at the floating gate, the program efficiency of the present invention is estimated to be closer to $\frac{1}{1}$, where almost all the electrons are injected onto the floating gate.

Also with the present invention, the control gates formed along the sidewalls of third trenches 44 can be separately optimized for conduction performance as well as punch-through immunity without affecting cell size. Additionally, the punch-through suppression between source region 38 and the buried bit-line region 50 can be optimized by embedding the source region having a first conductivity type (e.g. N type) in a well having a second conductivity type (e.g. P type) different from the first conductivity type, along with using other sub-surface implant(s) that do not affect the conduction characteristics of the memory cell. Furthermore, having source region 38 and bit-line region 50 separated vertically as well as horizontally allows easier optimization of reliability parameters without affecting cell size.

Lastly, the memory cell structure of the present invention includes "raised source lines" 42, meaning that the conductive poly blocks 42 run along (and are electrically connected to) the source lines 38, but are disposed above the substrate surface. The raised source lines 42 have sidewalls that are disposed laterally adjacent to sidewalls of floating gates 14, but are insulated therefrom by oxide layers 36 and oxide spacers 40. This configuration provides decreased electrical resistance along the length of the source lines 38, and provides capacitive coupling between the raised source lines 42 and floating gates 14 (in addition to the capacitive coupling caused by the overlap between the floating gates 14 and the source regions 38).

With the present invention, the poly blocks 42 are self aligned to the source regions 38, and the floating gates 14 are self aligned between the poly blocks 42 and the control gate poly spacers 56 (and thus are self aligned to the first and second portions 78/80 of the channel regions 76).

First Alternate Embodiment

FIGS. 4A to 4G illustrate a first alternate process for forming the memory cell structure similar to that illustrated in FIG. 3U, where the nitride etch used to remove nitride layer 30 is performed later in the process to preserve part of the nitride layer. This first alternate process begins with the same structure as shown in FIG. 3O, which is shown again in FIG. 4A.

Figure 4A:
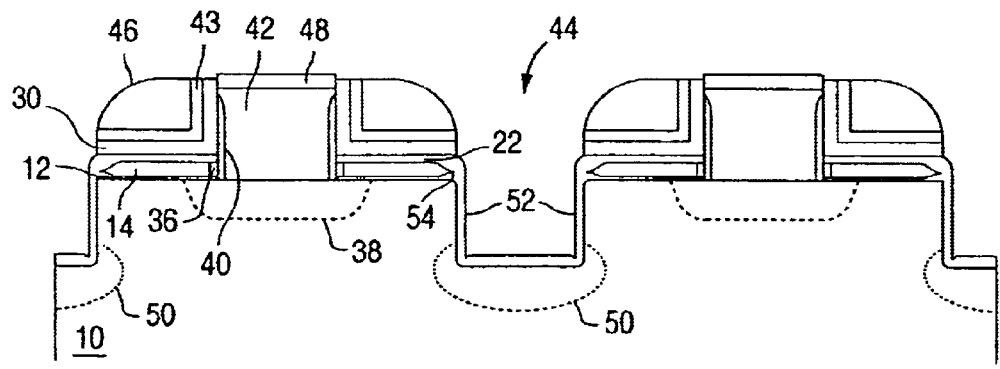
FIGS. 4A–4G are cross sectional views of a semiconductor structure showing in sequence the steps in a first alternate processing of the semiconductor structure of FIG. 3O in the formation of a non volatile memory array of floating memory cells of the present invention.
Figure 4B:
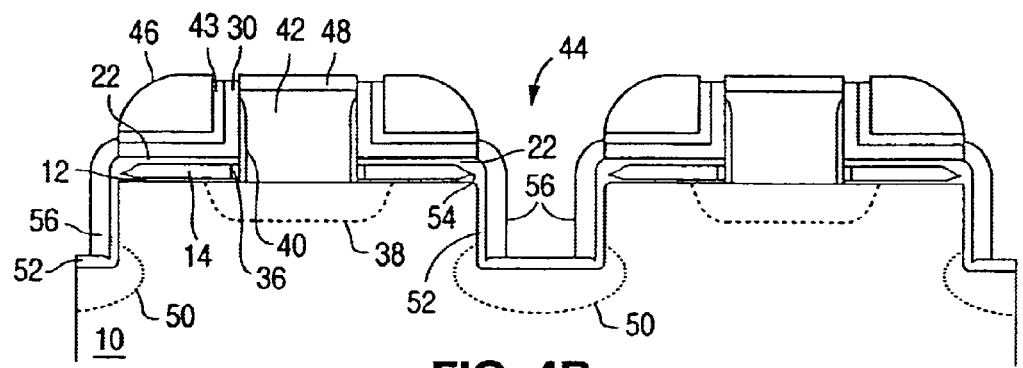

The formation of poly spacers 56 along sidewalls of third trenches 44 is formed in the same way as described above with respect to FIG. 3P, except that a thinner poly layer is preferably deposited over the structure (e.g. 700 Å thick), followed by a dry anisotropic dry etch process to remove the deposited poly layer, except for poly spacers 56 left along the sidewalls of third trenches 44. The poly etch is preferably performed to ensure the top edge of each poly spacer 56 is generally level with the top edge of the adjacent nitride layer 30 (as shown in FIG. 4B), or is located in-between the adjacent floating gate edge 54 and the adjacent top edge of nitride layer 30.

Figure 4C:
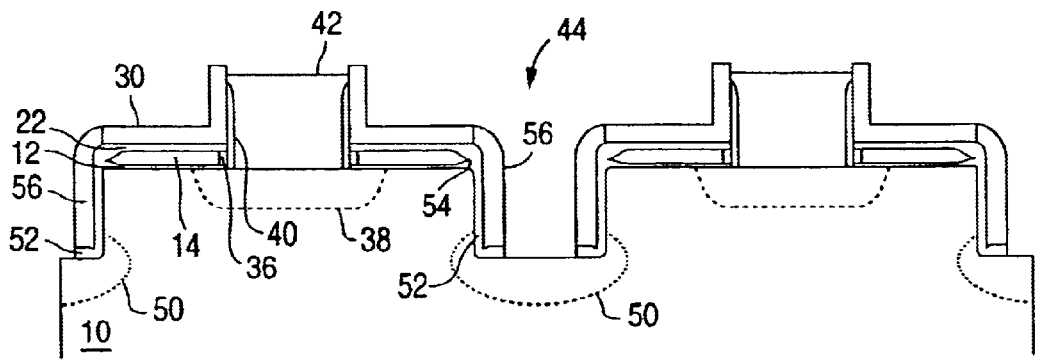
Figure 4D:
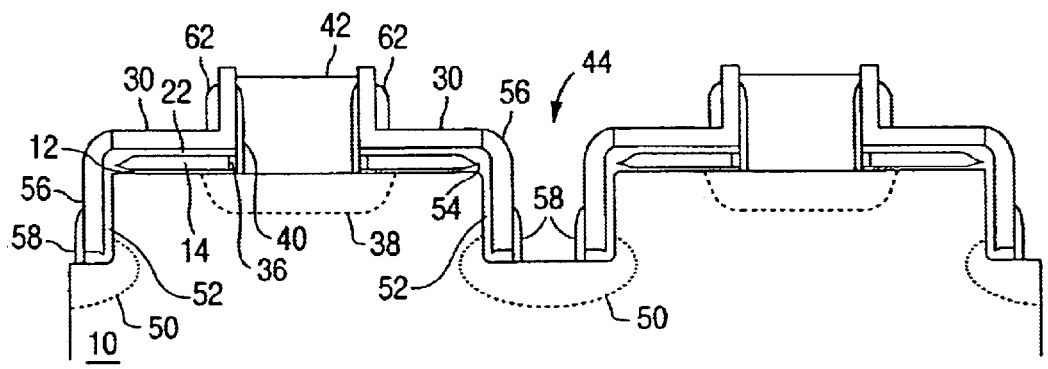

A nitride etch process is then used to remove nitride spacers 46. An oxide etch follows to remove oxide layers 48 and 43, and the exposed portions of oxide layer 52 at the bottom of third trenches 44 (in-between poly spacers 56), as shown in FIG. 4C. Insulating spacers 58 (preferably oxide) are formed along the sidewalls of third trenches 44 by depositing a layer of oxide over the structure (e.g. 500 to 1200 Å thick), followed by an oxide etch (e.g. RIE). This oxide deposition and etch process also forms oxide spacers 62 adjacent the vertical portions of nitride layer 30. The resulting structure is shown in FIG. 4D.

Figure 4E:
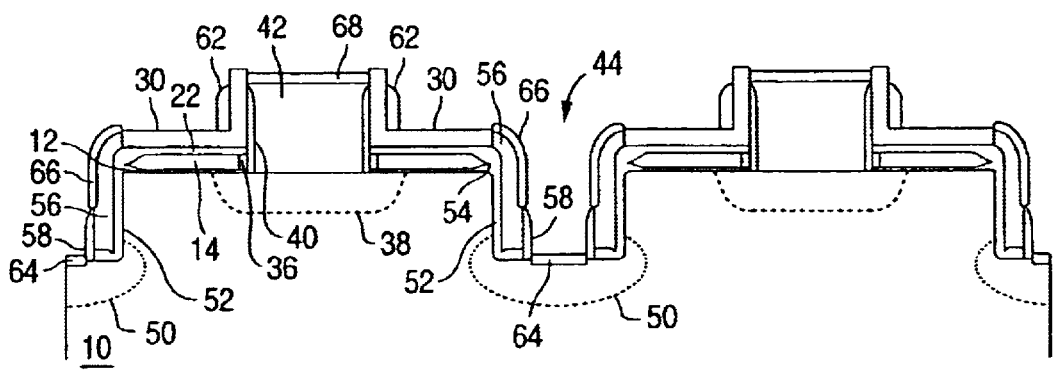

A metal deposition step is then performed, to deposit a metal such as tungsten, cobalt, titanium, nickel, platinum, or molybdenum over the structure. The structure is then annealed, permitting the hot metal to flow and to seep into the exposed portions of the substrate 10 at the bottom of third trenches 44 to form the salicide layer 64. The hot metal also forms the polycide layer 66 on the exposed top portions of poly spacers 56 and the polycide layer 68 on the exposed top portions of poly blocks 42. After a metal etch process to remove the remaining metal, the resulting structure is shown in FIG. 4E.

Figure 4F:
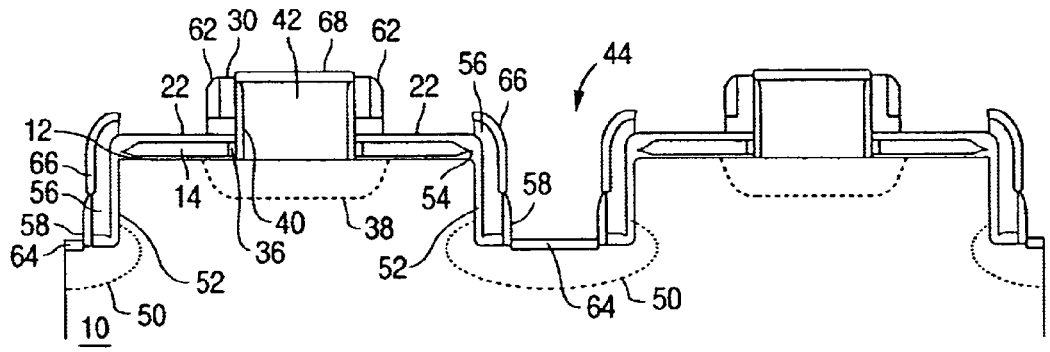
Figure 4G:
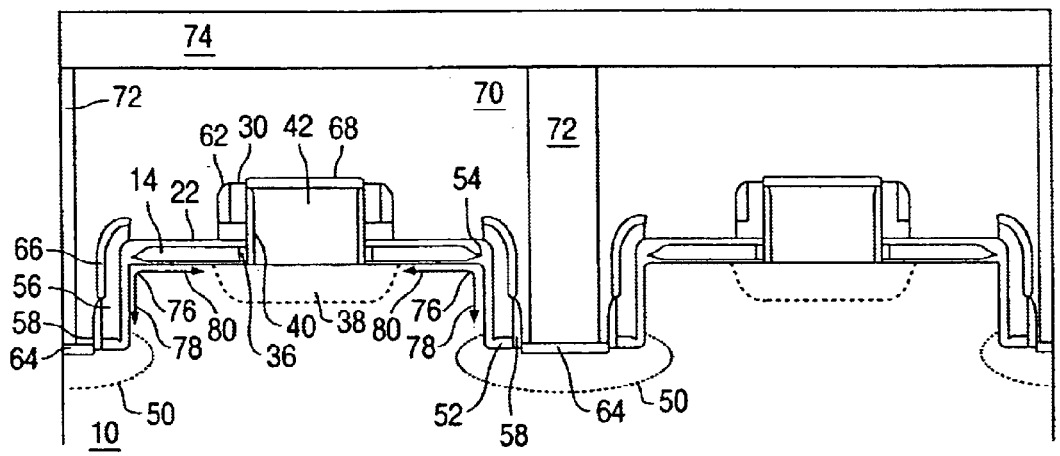

A nitride etch process follows (e.g. in hot phosphoric acid), which removes exposed portions of nitride layer 30 (i.e. those portions not protected by oxide spacers 62), as shown in FIG. 4F. The structure is processed as described above with respect to FIG. 3U (i.e. passivation, contact formation, and bit line formation), to result in the structure shown in FIG. 4G.

The major difference in this first alternate embodiment from the process of FIGS. 3A–3U is that the nitride etch step for removing nitride layer 30 is performed later in the process. The result is that nitride layer 30 remains intact to protect oxide layer 22 (over floating gate 14) during the salicide/polycide metalization process. Moreover, a portion of the nitride layer 30 remains intact in the final memory cell structure (over floating gate 14 and laterally adjacent to poly block 42). Given the higher dielectric constant of nitride (compared to oxide), this remaining portion of nitride layer 30 provides a stronger sidewall fringing field, and hence enhances the capacitance coupling between the source region 38 (including poly block 42) and the floating gate 14 for each of the memory cells.

Second Alternate Embodiment

FIGS. 5A to 5I illustrate a second alternate process for forming the memory cell structure similar to that illustrated in FIG. 3U, where ion implantation used to form second regions 50 is performed later in the process, and an additional tunnel oxide formation is included. This second alternate process begins with the same structure as shown in FIG. 3M, which is shown again in FIG. 5A.

Figure 5A:
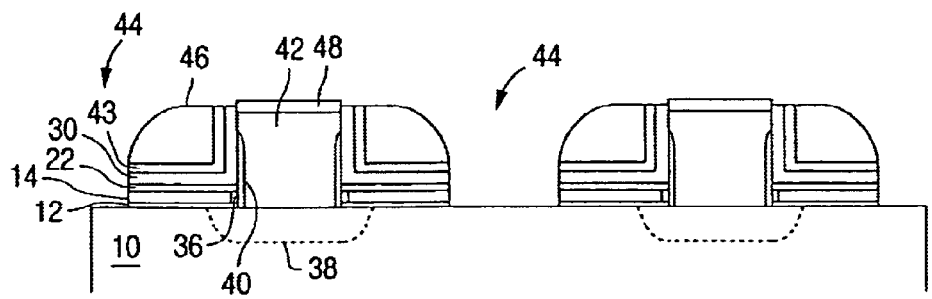
FIGS. 5A–5I are cross sectional views of a semiconductor structure showing in sequence the steps in a second alternate processing of the semiconductor structure of FIG. 3M in the formation of a non volatile memory array of floating memory cells of the present invention.
Figure 5B:
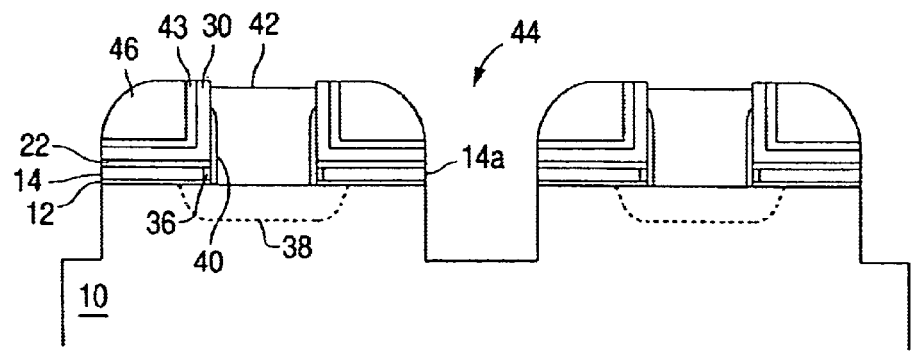
Figure 5C:
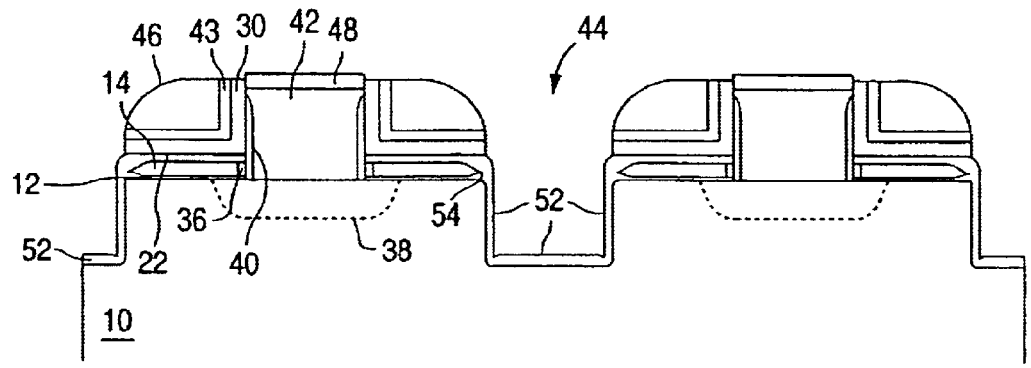

The same silicon and oxide etch processes are performed as described above with respect to FIG. 3N to extend third trenches 44 down into substrate 10, and remove oxide layer 48, as shown in FIG. 5B. However, the ion implantation used to form second regions 50 is not performed at this time. Instead, the oxidation process as discussed with respect to FIG. 3O is performed to form oxide layer 52 and floating gate edges 54, and re-grow oxide layer 48, as illustrated in FIG. 5C.

Figure 5D:
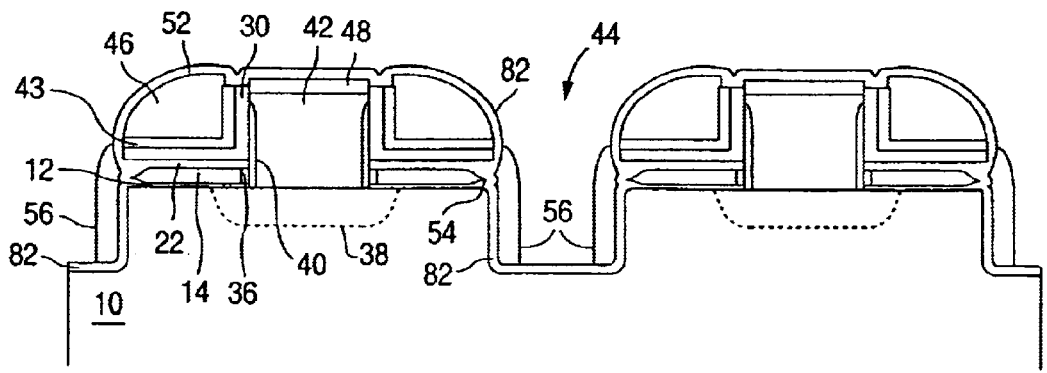

A controlled oxide etch process (e.g. with 10 to 1 diluted HF etchant) is performed to remove oxide layer 52 and expose floating gate pointed edge 54. A thin layer of oxide 82 (e.g. 130 Å) is deposited (e.g. by HTO deposition) over the structure. The removal of oxide layer 52 and deposition of oxide layer 82 provides a tunneling oxide layer adjacent to the pointed edge 54 having a controlled thickness. Poly spacers 56 are then formed along sidewalls of third trenches 44 by depositing a poly layer over the structure (e.g. 700 Å thick), followed by a dry anisotropic dry etch process to remove the deposited poly layer except for poly spacers 56 left along oxide layer 82 in third trenches 44. Preferably, the poly etch is performed to ensure the top edge of each poly spacer 56 is generally level with the top edge of the adjacent nitride layer 30 (as shown in FIG. 5D), or is located in-between the adjacent floating gate edge 54 and the adjacent top edge of nitride layer 30.

Figure 5E:
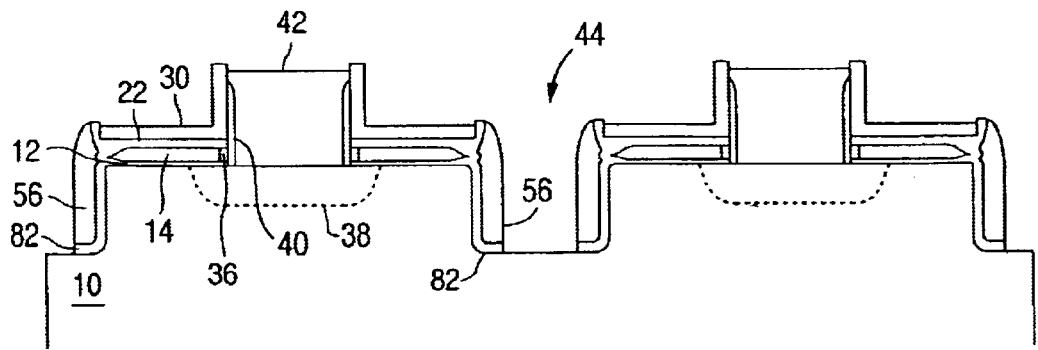
Figure 5F:
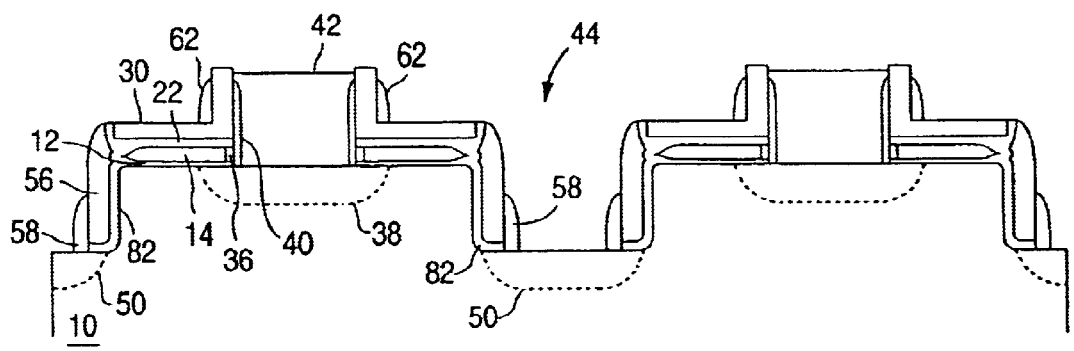

An oxide etch process is then used to remove exposed portions of oxide layer 82 (i.e. those portions not protected by poly spacers 56) and oxide layer 48. A nitride is then used to remove nitride spacers 46, followed by an oxide etch to remove oxide layer 43. The resulting structure is shown in FIG. 5E. Suitable ion implantation is made across the entire surface of the structure to form second regions 50 (buried bit-line regions) in the substrate 10 underneath third trenches 44. Outside of third trenches 44, the ions are blocked and have no effect. The insulating spacers 58 (preferably oxide) are formed along the sidewalls of third trenches 44 by depositing a layer of oxide over the structure (e.g. 500 to 1200 Å thick), followed by an oxide etch (e.g. RIE). This oxide deposition and etch process also forms oxide spacers 62 adjacent the vertical portions of nitride layer 30. The resulting structure is shown in FIG. 5F. It should be noted that the ion implantation process could be performed after the formation of insulating spacers 58, or even after forming control gates 56 but before removal of spacers 46.

Figure 5G:
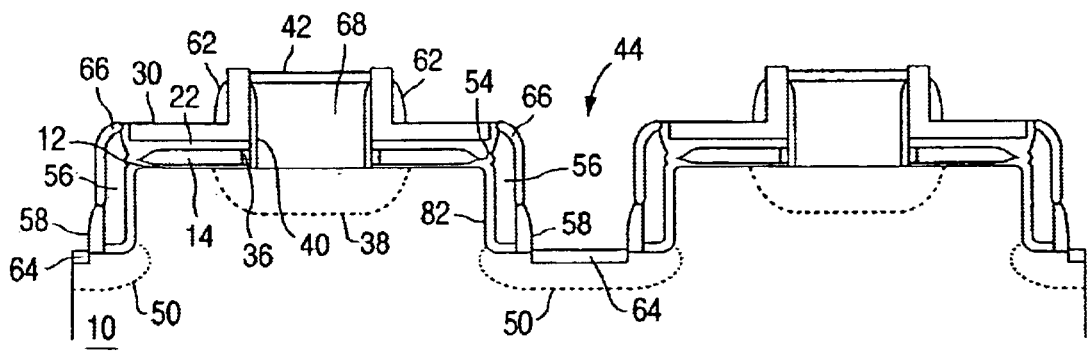

A thermal anneal process (e.g. RTA or furnace thermal anneal) is used to drive the first and second regions 38/50 deeper into the substrate 10. A metal deposition step is then performed, to deposit a metal such as tungsten, cobalt, titanium, nickel, platinum, or molybdenum over the structure. The structure is then annealed to form the salicide regions 64 (at the bottom of third trenches 44 between oxide spacers 58), to form the polycide regions 66 (over the exposed top portions of poly spacers 56), and to form the polycide regions 68 (on the exposed top portions of poly blocks 42). The metal deposited on the remaining structure is removed by a metal etch process. The resulting structure is shown in FIG. 5G.

Figure 5H:
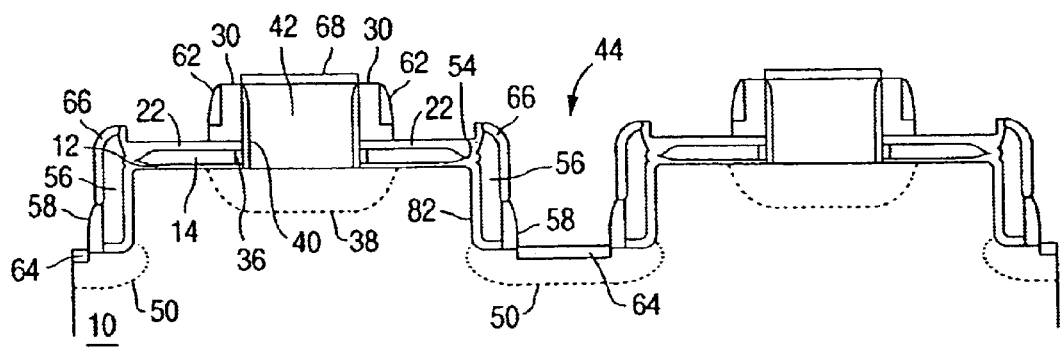
Figure 5I:
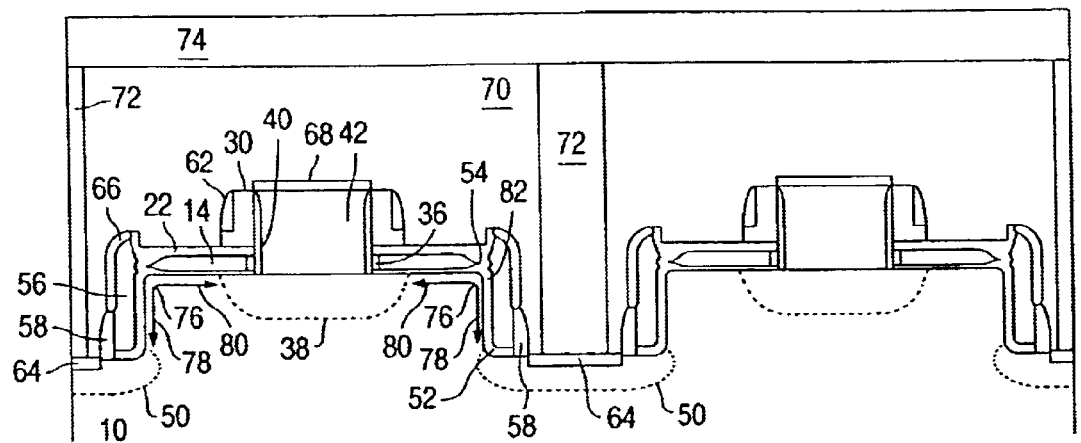

A nitride etch process follows (e.g. in hot phosphoric acid), which removes exposed portions of nitride layer 30 (i.e. those portions not protected by oxide spacers 62), as shown in FIG. 5H. The structure is then processed as described above with respect to FIG. 3U (i.e. passivation, contact formation, and bit line formation), to result in the structure shown in FIG. 5I.

This second alternate embodiment shifts the ion implantation step used to form second regions 50 until after the control gate spacers 56 are formed. The oxide layer 82 used for tunneling between the floating gate edge 54 and the control gate 56 is formed by an oxide deposition step (e.g. HTO), instead of by a thermal growth step, to better achieve uniformity given the stress induced by the corners of third trenches 44. Lastly, the remaining portion of the nitride layer 30 provides a stronger sidewall fringing field, and hence enhances the capacitance coupling between the source region 38 (including poly block 42) and the floating gate 14.

Third Alternate Embodiment

FIGS. 6A to 6J illustrate a third alternate process for forming the memory cell structure similar to that illustrated in FIG. 3U, and includes "L" shaped control gates and channel regions each having two separate horizontal portions separated by a vertical portion. This third alternate process begins with the same structure as shown in FIG. 3M, which is shown again in FIG. 6A.

Figure 6A:
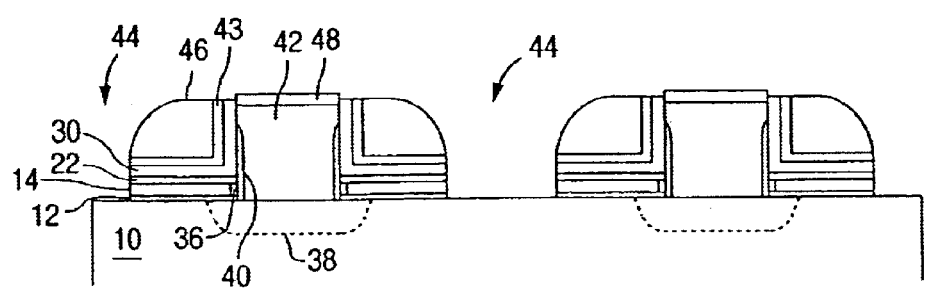
FIGS. 6A–6J are cross sectional views of a semiconductor structure showing in sequence the steps in a third alternate processing of the semiconductor structure of FIG. 3M in the formation of a non volatile memory array of floating memory cells of the present invention.
Figure 6B:
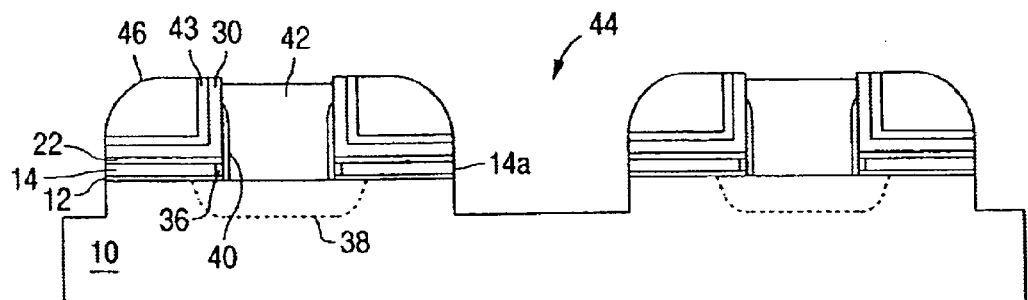
Figure 6C:
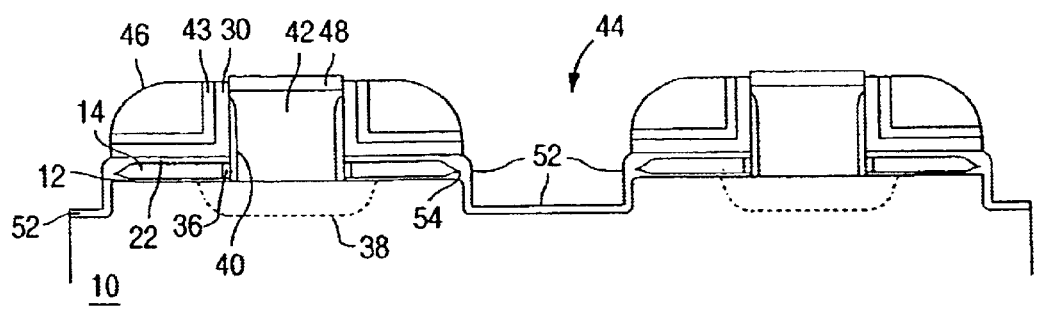

The same etch process is performed as described above with respect to FIG. 3N to extend third trenches 44 down into substrate 10, as shown in FIG. 6B. However, the ion implantation used to form second regions 50 is not performed at this time. Instead, the oxidation process as discussed with respect to FIG. 3O is performed to form oxide layer 52 and floating gate edges 54, as illustrated in FIG. 6C.

Figure 6D:
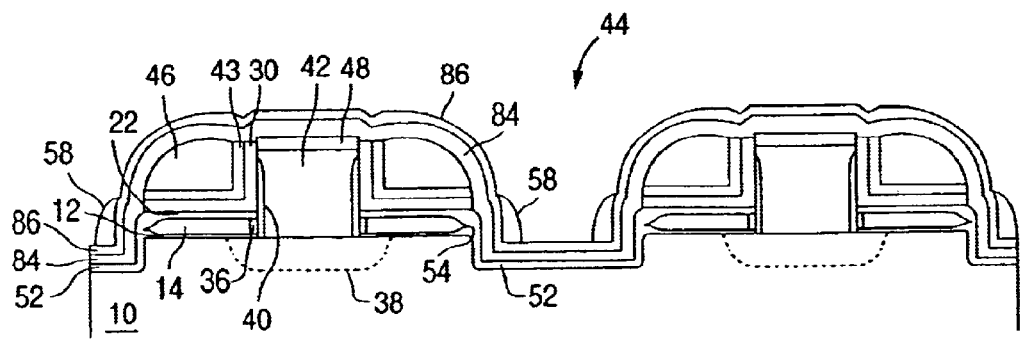

A poly layer 84 is formed over the structure. An optional polycide layer 86 is formed on the upper surface of poly layer 84, the metal deposition and anneal process discussed above. The total thickness of layers 84 and 86 is preferably about 700 Å. Next, an oxide layer is formed over the structure, followed by an oxide etch that removes the oxide layer except for the oxide spacers 58 formed against poly layer 84 in third trenches 44. The resulting structure is shown in FIG. 6D.

Figure 6E:
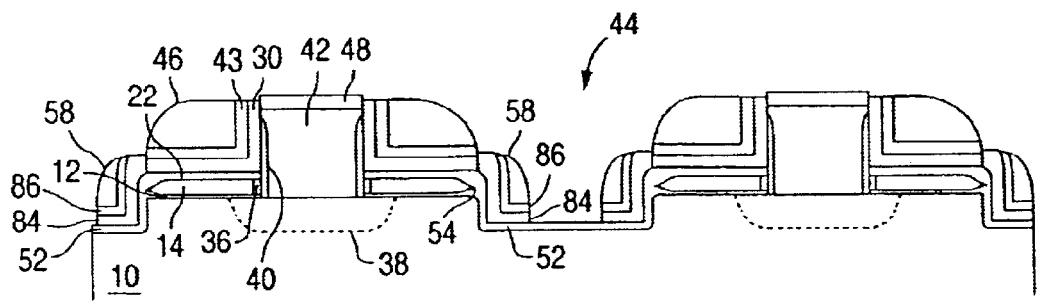

A poly etch process is used to remove the exposed portions of polycide layer 86 and poly layer 84 (i.e. portions not protected by oxide spacers 58), leaving "L" shaped segments of poly and polycide layers 84/86 along the side and bottom walls of trenches 44. Preferably, this poly etch, and the formation of oxide spacers 58, are performed to ensure the top edges of each poly/polycide segment 84/86 are generally level with the top edge of the adjacent nitride layer 30 (as shown in FIG. 6E), or is located in-between the adjacent floating gate edge 54 and the adjacent top edge of nitride layer 30.

Figure 6F:
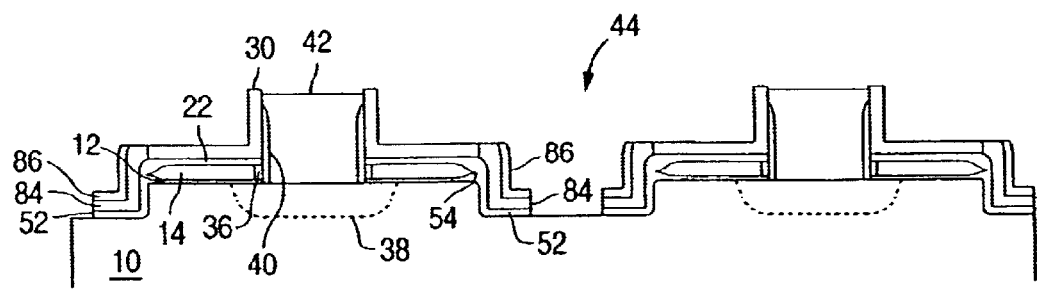
Figure 6G:
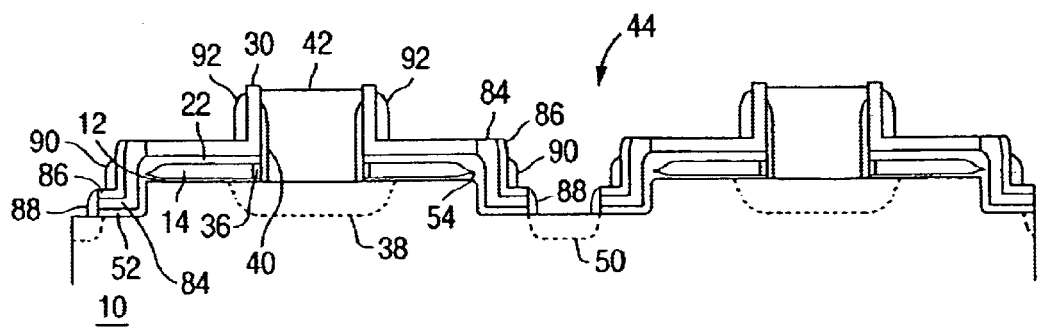

A nitride etch process is used to remove the exposed nitride spacers 46. An oxide etch is then used to remove oxide spacers 58 (in third trenches 44), oxide layer 48 (over poly blocks 42), oxide layer 43, and the portions of oxide layer 52 (at the bottom of third trenches 44 between poly segments 84), as shown in FIG. 6F. An oxide deposition and etch back process (e.g. RIE dry etch) is used to form oxide spacers 88 (against exposed and vertically oriented end portions of layers 52, 84 and 86 in third trenches 44), oxide spacers 90 (against vertically oriented portions of polycide layer 86 in third trenches 44), and oxide spacers 92 (against vertically oriented portions of nitride layer 30). Suitable ion implantation is made across the entire surface of the structure to form the second regions 50 (buried bit-line regions) in the substrate 10 underneath third trenches 44. The ions are also implanted into poly blocks 42 to dope (or further dope) these blocks. In areas outside of third trenches 44, and except for poly blocks 42, the ions are blocked and have no effect. It should be noted that the ion implantation process could be performed before the formation of oxide spacers 88/90/92, or before the removal of nitride spacer 46. The resulting structure is shown in FIG. 6G.

Figure 6H:
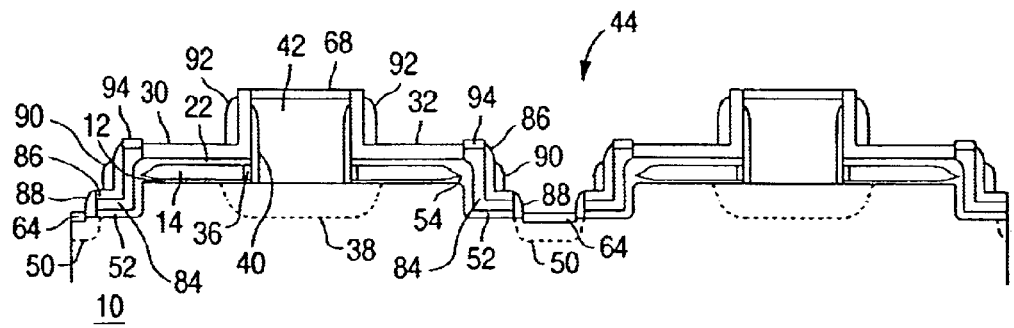

A metal deposition step is then performed, to deposit a metal such as tungsten, cobalt, titanium, nickel, platinum, or molybdenum over the structure. The structure is then annealed to form the salicide regions 64 (at the bottom of third trenches 44 between oxide spacers 88), the polycide regions 94 (over the exposed top portions of poly layer segments 84), and the polycide regions 68 on the exposed top portions of poly blocks 42. The metal deposited on the remaining structure is removed by a metal etch process. The resulting structure is shown in FIG. 6H.

Figure 6I:
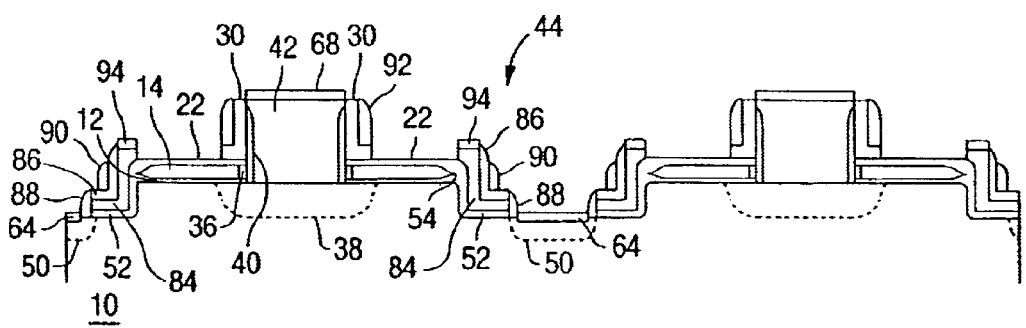
Figure 6J:
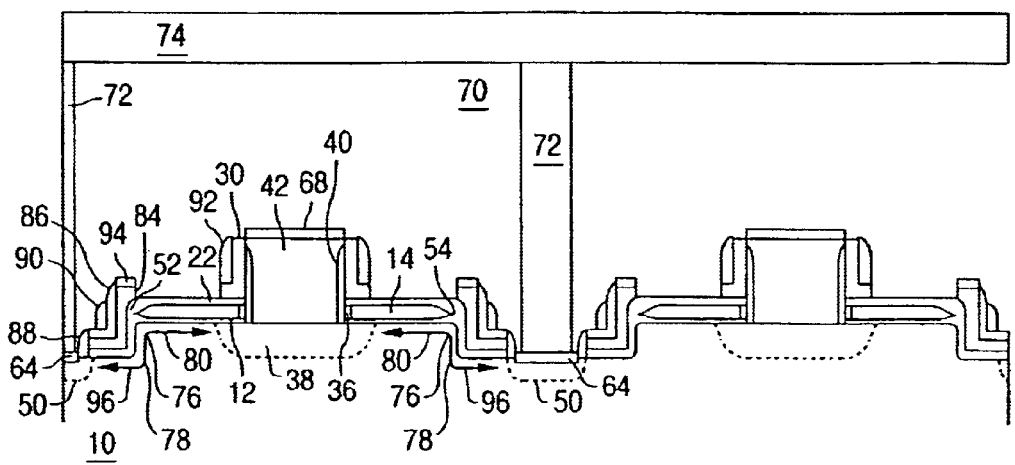

A nitride etch process follows (e.g. in hot phosphoric acid), which removes exposed portions of nitride layer 30 (i.e. those portions not protected by spacers oxide 92), as shown in FIG. 6I. The structure is then processed as described above with respect to FIG. 3U (i.e. passivation, contact formation, and bit line formation), to result in the structure shown in FIG. 6J.

This third alternate embodiment shifts the ion implantation step used to form second regions 50 until after the bottom of third trenches 44 are narrowed by the formation of poly layer segments 84 and polycide 86. Thus, second regions 50 are formed under only a center portion of the third trench bottom walls. This results in the formation a channel region 76 in the substrate for each cell having three portions joined together at generally right angles, with a first horizontal portion 80 extending between the third trench 44 and the source region 38, a vertical portion 78 extending along the vertical wall of third trench 44, and a second horizontal portion 96 extending between the vertical portion 78 and the drain region 50, so that the channel region 76 is generally "S" shaped. The remaining portion of the nitride layer 30 provides a stronger sidewall fringing field, and hence enhances the capacitance coupling between the source region 38 (including poly block 42) and the floating gate 14. Lastly, the control gate thickness is dictated by a poly deposition step, as opposed to poly deposition and etch back process that can be more difficult to precisely control.

Fourth Alternate Embodiment

Figure 7A:
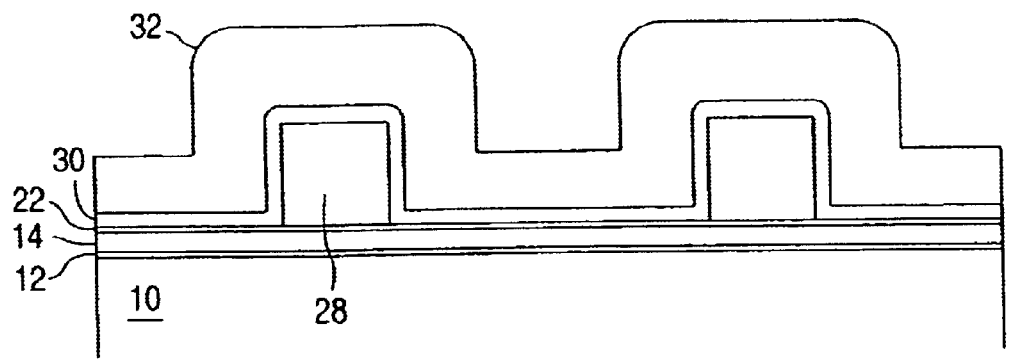
FIGS. 7A–7Z are cross sectional views of a semiconductor structure showing in sequence the steps in a fourth alternate processing of the semiconductor structure of FIG. 3C in the formation of a non volatile memory array of floating memory cells of the present invention.
Figure 7B:
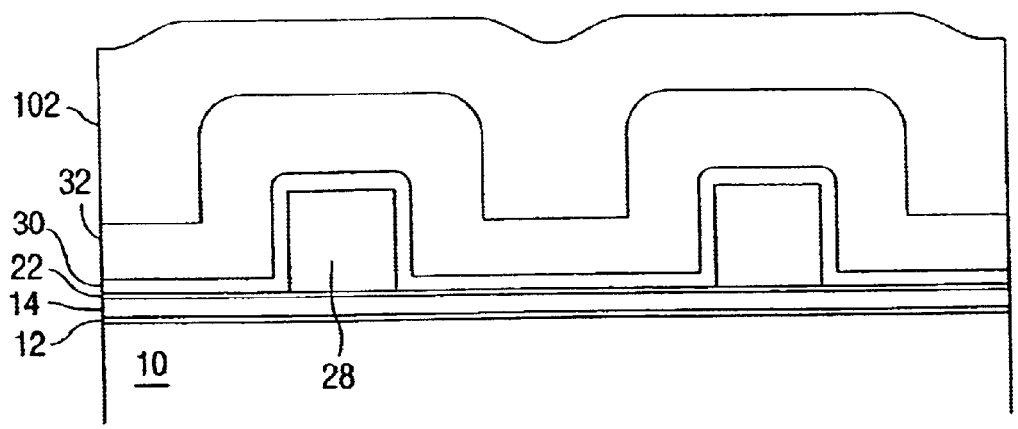
Figure 7C:
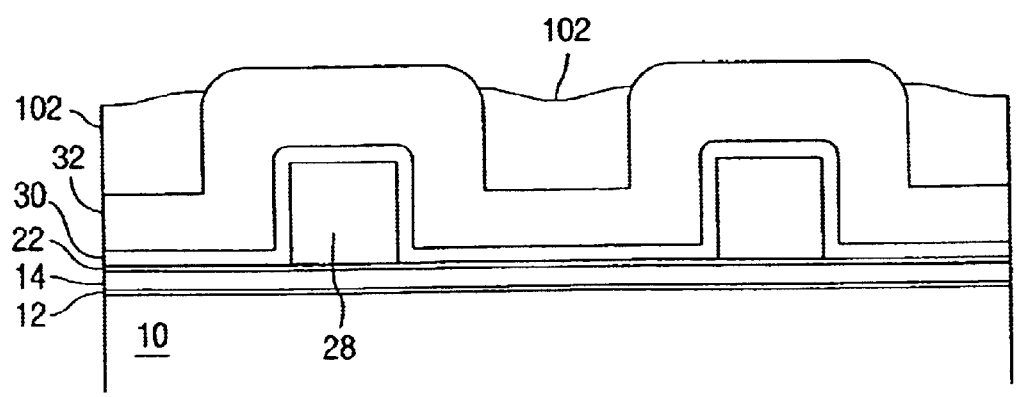
Figure 7D:
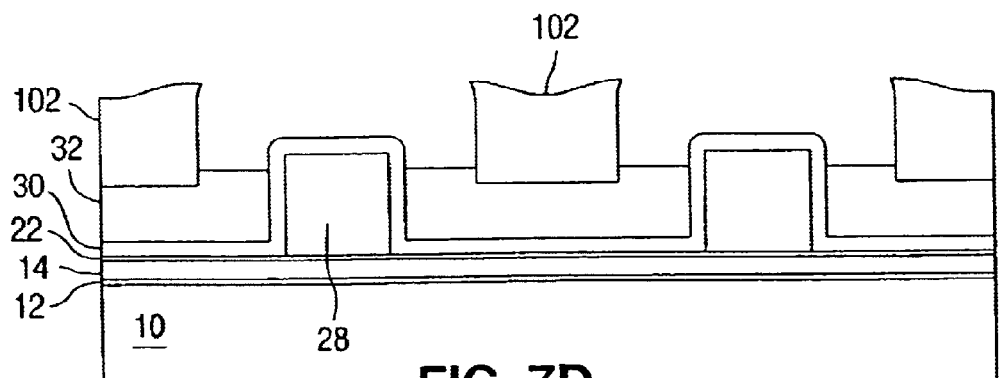
Figure 7E:
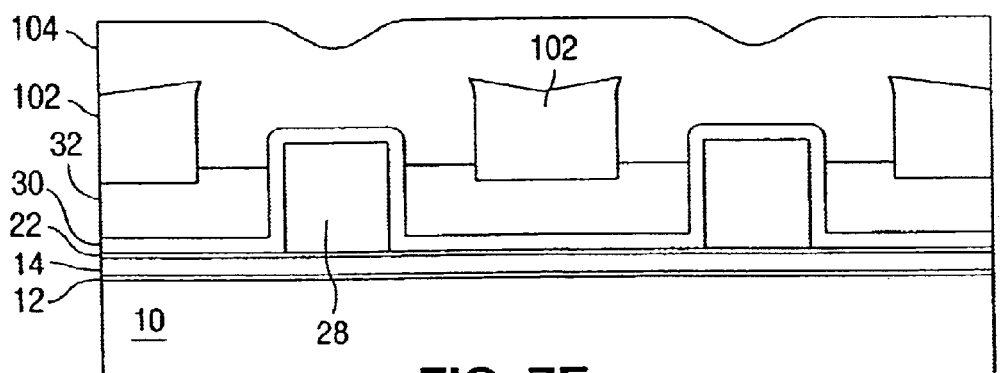
Figure 7F:
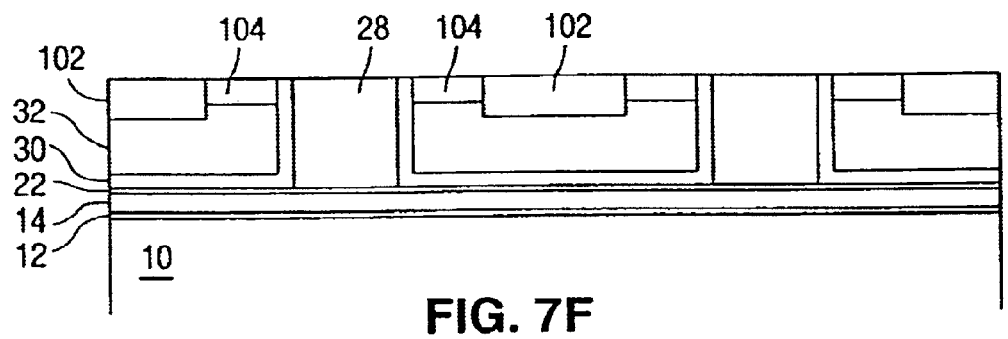
Figure 7G:
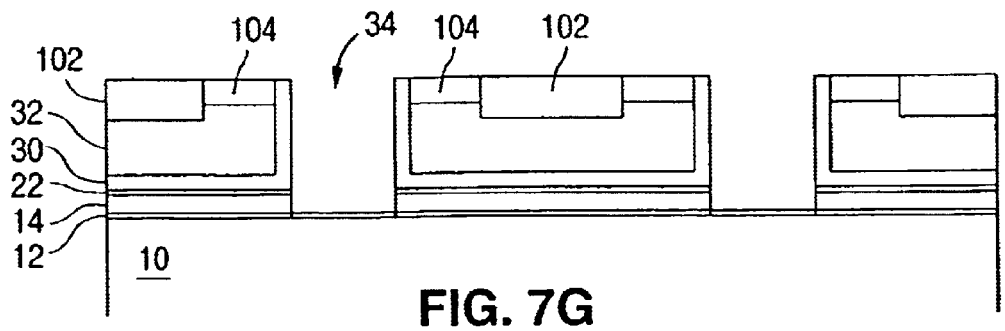
Figure 7H:
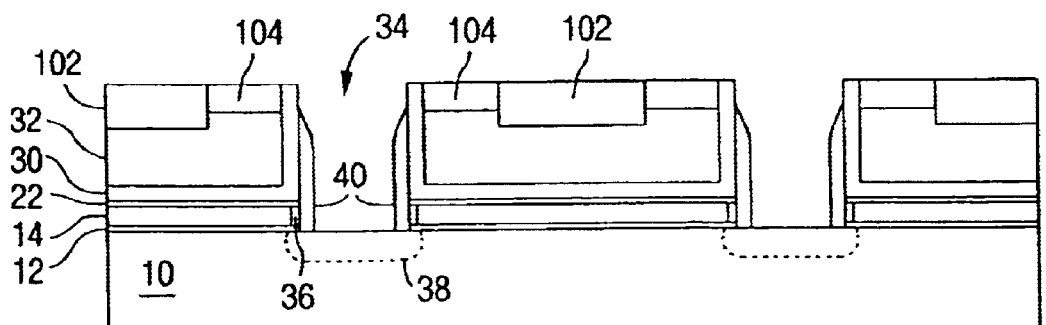
Figure 7I:
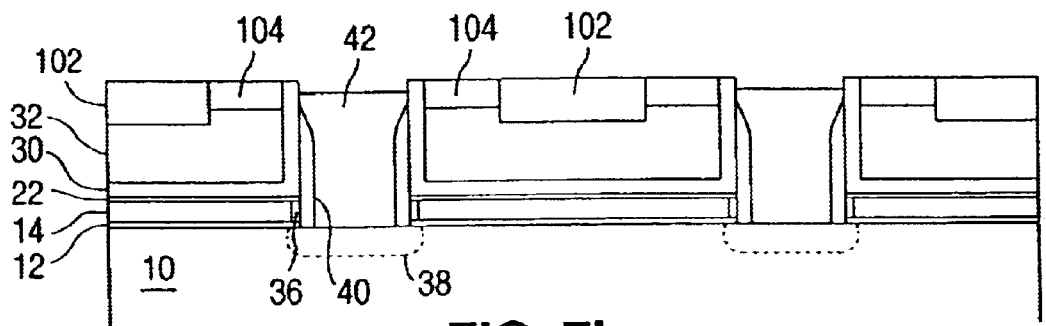
Figure 7J:
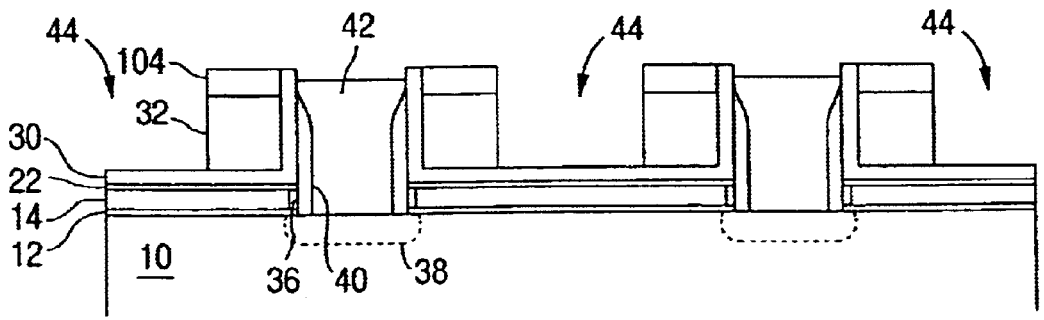
Figure 7K:
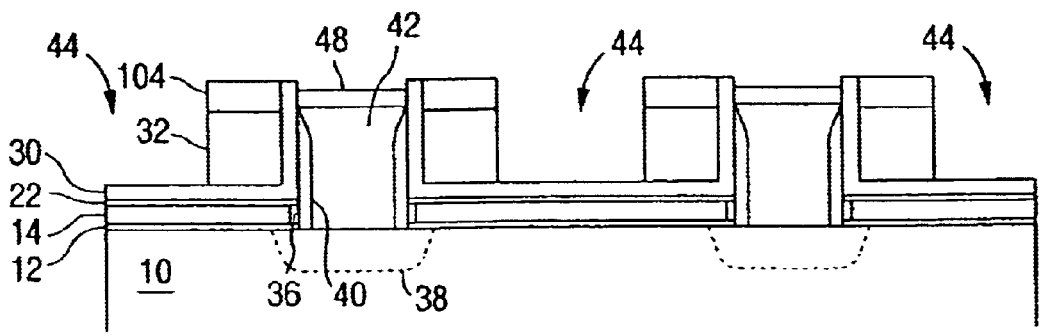
Figure 7L:
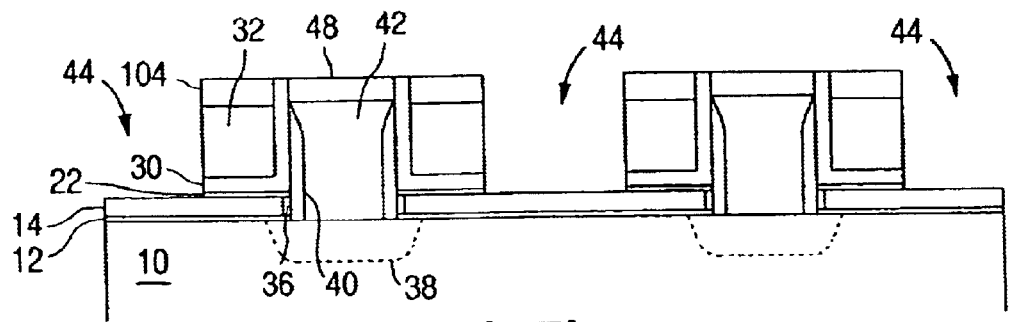
Figure 7M:
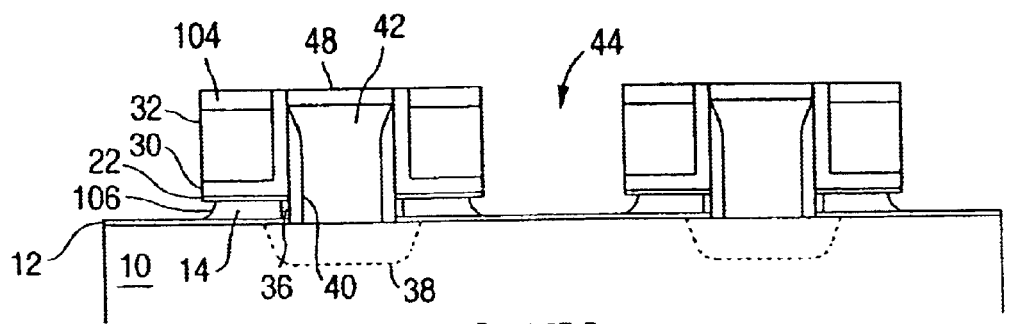
Figure 7N:
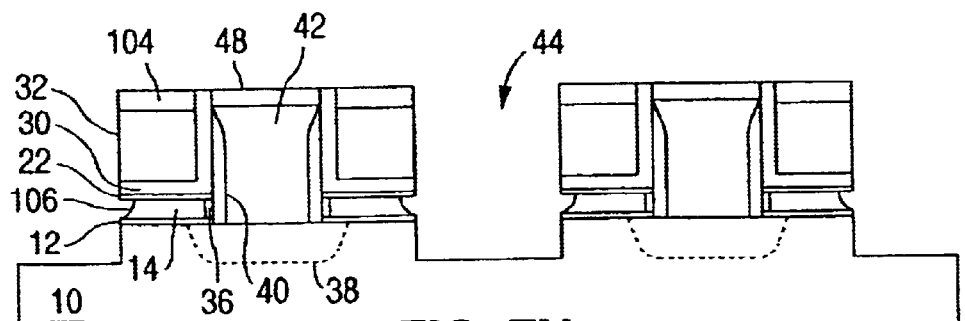
Figure 7O:
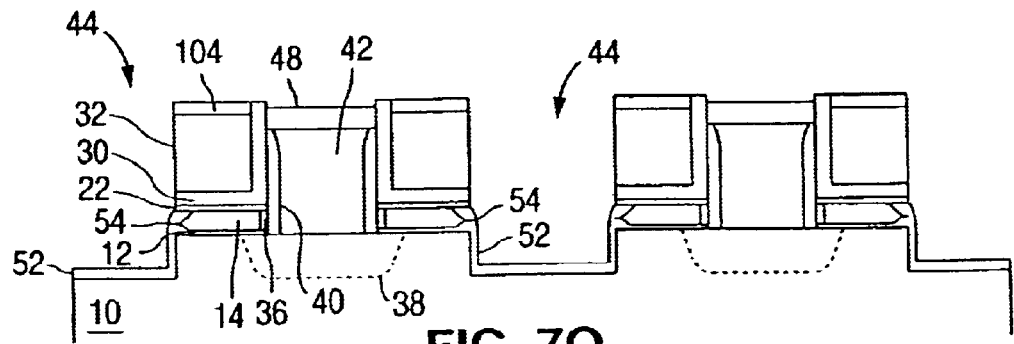
Figure 7P:
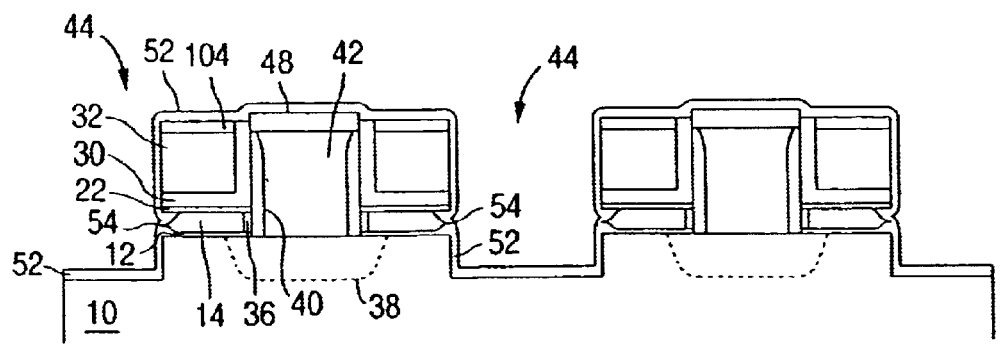
Figure 7Q:
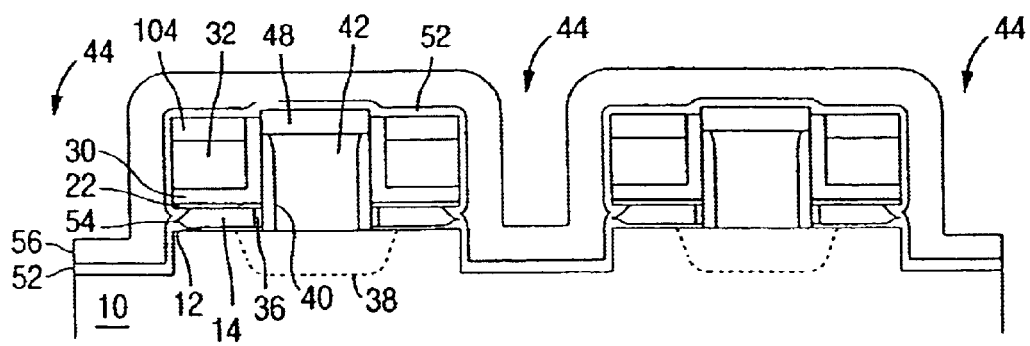
Figure 7R:
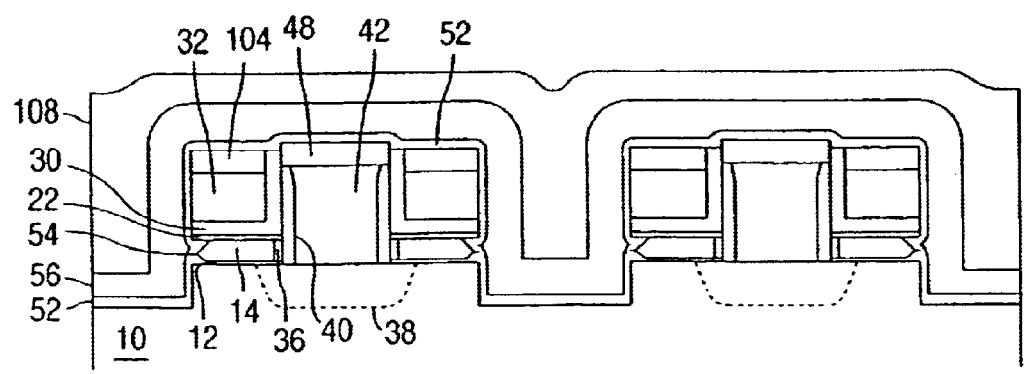
Figure 7S:
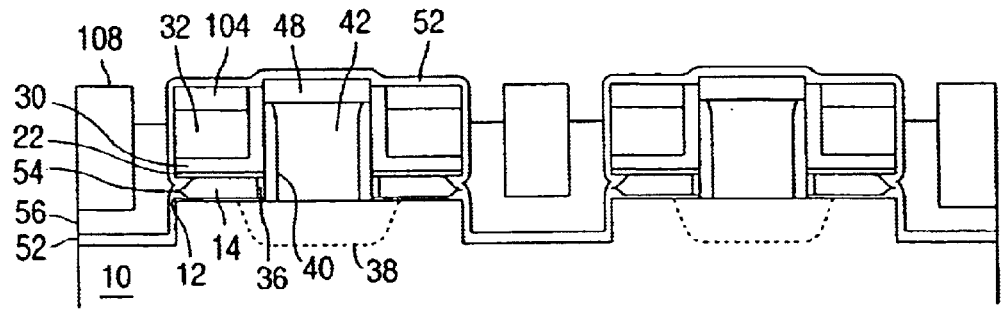
Figure 7T:
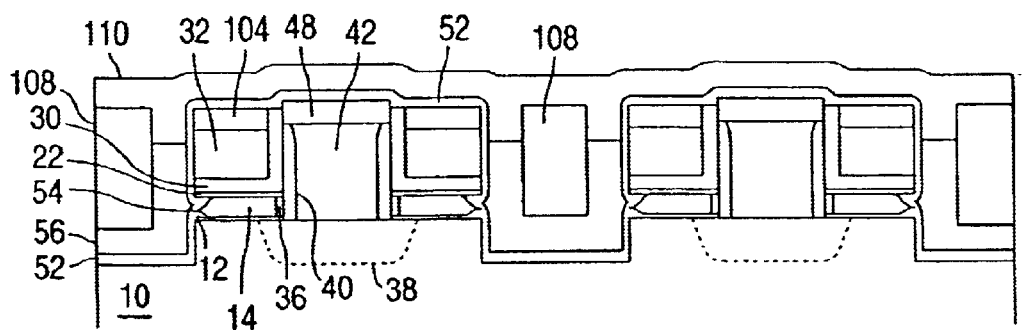
Figure 7U:
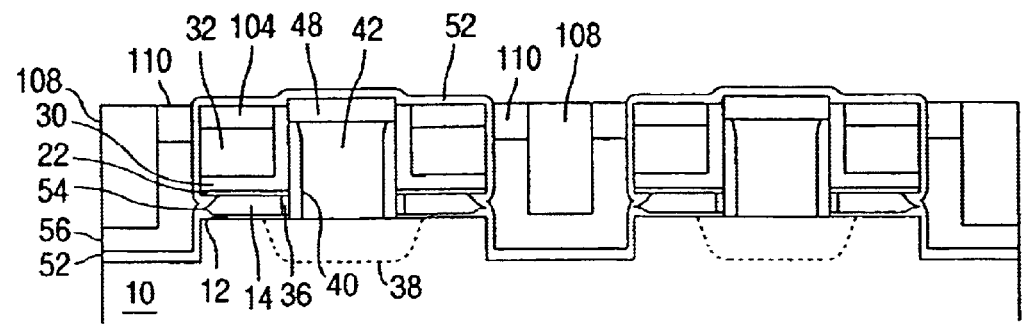
Figure 7V:
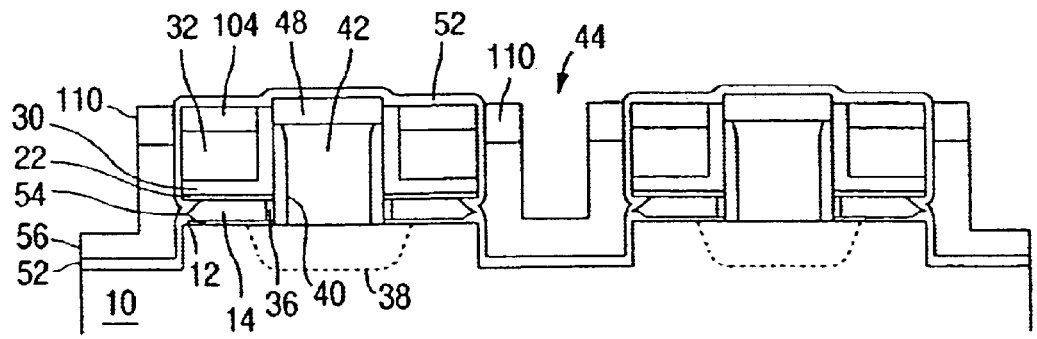
Figure 7W:
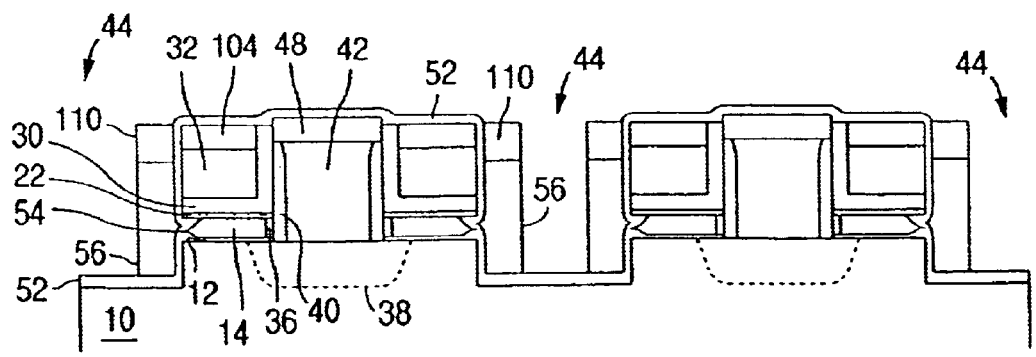
Figure 7X:
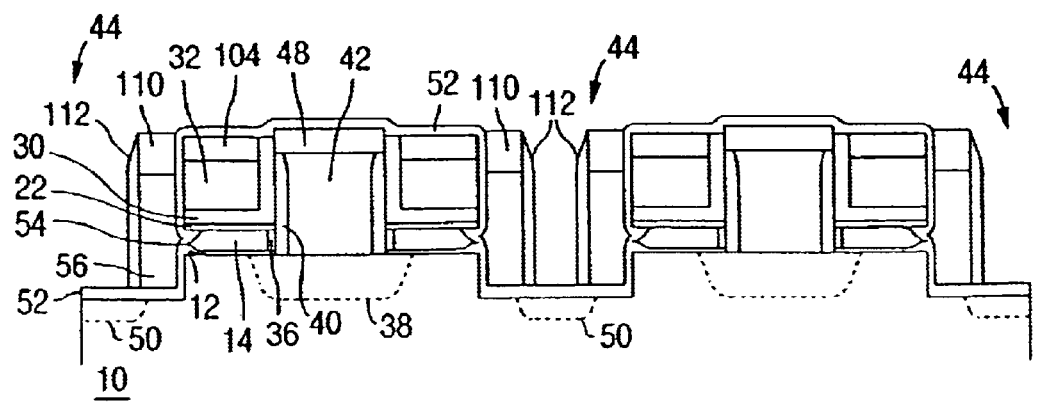
Figure 7Y:
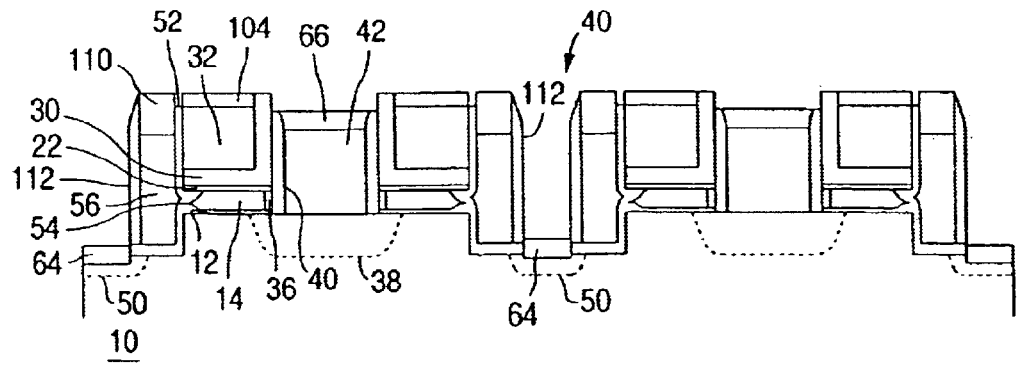
Figure 7Z:
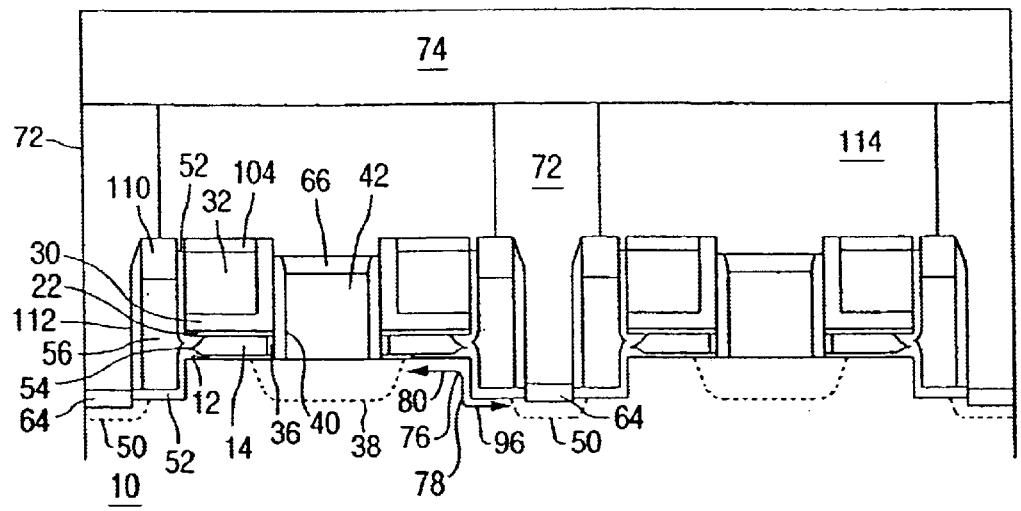

FIGS. 7A to 7Z illustrate a fourth alternate process for forming the memory cell structure similar to that illustrated in FIG. 3U, but utilizing a self alignment contact (SAC) scheme. This fourth alternate process begins with the same structure as shown in FIG. 3C, which is shown again in FIG. 7A.

A thick layer of dielectric material 102 (e.g. BSG) is deposited over the structure, as shown in FIG. 7B, to fill gaps between portions of oxide layer 32. A BSG etch process is used to etch down the BSG layer 102 generally even with the tops of oxide layer 32, using oxide layer 32 as an etch stop. The BSG etch process results in blocks of the BSG 102 disposed between the tops of oxide layer 32, as shown in FIG. 7C. An oxide etch process is used to etch the exposed portions of oxide layer 32 down generally even with the tops of nitride layer 30, using nitride layer 30 as an etch stop. A controlled oxide over-etch is used to etch down the exposed portion of oxide layer 32 a predetermined distance below the tops of nitride layer 30, as shown in FIG. 7D.

Next, a thick nitride layer 104 is deposited over the structure, as shown in FIG. 7E. A planarization etch process follows (e.g. CMP) to etch down nitride layer 104, BSG 102 and nitride 30 even with the tops of poly blocks 28 (using poly blocks 28 as the polishing stopper), and to leave the top surfaces of poly blocks 28 exposed. The resulting structure is shown in FIG. 7F.

A poly etch process is used to remove poly blocks 28 (using oxide layer 22 as an etch stop) to form second trenches 34. A controlled oxide etch is used to remove the portions of oxide layer 22 exposed at the bottoms of second trenches 34 (using poly layer 14 as an etch stop). Another poly etch process is performed to remove portions of poly layer 14 exposed at the bottoms of the second trenches 34 (using oxide layer 12 as an etch stop). The resulting structure is shown in FIG. 7G.

An oxide sidewall layer 36 is formed on the exposed ends of poly layer 14 at trenches 34 using a thermal oxidation process. Suitable ion implantation is then used to form first regions (source regions) 38 in the substrate 10 having a conductivity type (e.g. N type) that is different from that of the surrounding substrate (e.g. P type). Sidewall spacers 40 are then formed against the walls of the second trenches 34 by depositing a thin layer of oxide (e.g. 200 Å) over the entire structure, followed by an anisotropic etch process (e.g. RIE dry etch), to remove the deposited oxide layer except for spacers 40. This oxide etch process also removes the exposed portions of oxide layer 12 at the bottom of second trenches 34 to expose the substrate 10. The resulting structure is shown in FIG. 7H.

The second trenches are filled with poly blocks 42, preferably by depositing a thick layer of poly silicon over the structure, followed by a planarization process (i.e. CMP) to remove the deposited poly silicon except for poly blocks 42 in second trenches 34. An optional poly etch is be performed to slightly recess the upper surfaces of poly blocks 42 relative to nitride layer 104 and oxide layer 32, to address any topography issues if present. The poly blocks 42 are in direct electrical contact with source regions 38 of substrate 10, and can be doped in-situ or by a separate implant. The resulting structure is shown in FIG. 7I.

A BSG etch process (wet or dry) is used to remove BSG 102, exposing portions of oxide layer 32. An anisotropic etch (e.g. RIE) is then used to remove exposed portions of oxide layer 32 (i.e. portions not protected by nitride 104), leaving semi-recessed third trenches 44 disposed between oxide blocks 32, as illustrated in FIG. 7J.

Next, the structure is subjected to a thermal oxidation process, which forms an oxide layer 48 over poly blocks 42. Oxide layer 48 is self aligned to the poly blocks 42 (with a thickness, for example, of ~600 Å). During the thermal cycle of this oxidation process, the source regions 38 are driven deeper into the substrate. The resulting structure is shown in FIG. 7K.

An anisotropic (dry) nitride etch is used to remove the portions of nitride layer 30 that are exposed in third trenches (between oxide blocks 32), using oxide layer 22 as an etch stop. This nitride etch also removes some of the exposed portions of nitride layer 30 adjacent poly blocks 42, as well as reducing the thickness of nitride layer 104 (e.g. down to a thickness of ~300–500 Å). An anisotropic oxide etch follows to remove the portions of oxide layer 22 that are exposed in third trenches 44 (between oxide blocks 32), using poly layer 14 as an etch stop. This oxide etch also slightly consumes small portions of oxide layer 48. The resulting structure is shown in FIG. 7L.

An anisotropic (dry) poly etch is next performed to remove the portions of poly layer 14 that are exposed in third trenches (between oxide blocks 32), using oxide layer 12 as an etch stop. This poly etch is preferably performed to form a slope or taper region 106 on the edge of poly layer 14 facing third trenches 44, as shown in FIG. 7M.

An anisotropic (dry) oxide etch follows, which removes the portions of oxide layer 12 that are exposed in third trenches (between oxide blocks 32), which exposes the substrate 10 at the bottom of third trenches 44. This oxide etch also slightly consumes small portions of oxide layer 48. The resulting structure is shown in FIG. 7M. Next, with the silicon substrate 10 left exposed at the bottom of third trenches 44, a silicon (dry) etch process is performed to extend third trenches 44 down into substrate 10, to a depth of 500 Å to 1500 Å below the substrate surface. This etch is selected to have a 1-to-1 selectivity between silicon and oxide, so that it also etches a similar depth trench in the oxide isolation regions 16 (LOCOS or STI), wherein third trenches 44 are continuously formed and extend across the active and isolation regions 17/16. The resulting structure is shown in FIG. 7N.

An oxidation process is then performed, which oxidizes the exposed silicon surfaces of third trenches 44 to form a thin layer of oxide 52 (e.g. 150 Å) lining these silicon surfaces. This oxidation process also oxidizes the exposed tapered sides 106 of poly layer 14 that form part of the sidewalls of upper portions of third trenches 44, which results in horizontally oriented edges 54 each of which points directly toward one of the sidewalls of third trenches 44, as illustrated in FIG. 7O. Edges 54 can be elongated edges (i.e. like the sharp edge of a razor blade), or shorter edges (i.e. like the tip of a pencil). This oxidation process also thickens the oxide layer 48 over poly blocks 42.

An optional oxide layer optimization process is next, where the thickness of the thermally grown Fowler-Nordheim tunneling oxide can be optimized by removing oxide layer 52 from the third trenches 44, followed by an HTO oxide deposition step to reform oxide layer 52 over the entire structure having a well controlled thickness (e.g. 150 Å). The resulting structure is shown in FIG. 7P.

A poly layer 56 is formed over the structure (e.g. 800 Å thick), as shown in FIG. 7Q. Metalized polysilicon (not shown) can be formed on the upper surface of poly layer 56. A layer of dielectric material 108 (e.g. BSG, ~1000 Å) is then formed over poly layer 56, as shown in FIG. 7R. A BSG etch process is then used to etch BSG 108 down even with oxide layer 52, followed by a poly etch to etch poly layer 56 down even with oxide layer 52. A CMP planarization could alternately be used instead of these BSG and poly etches. An additional poly etch is performed to recess the tops of poly layer 56 below the tops of oxide layer 52 and BSG 108, as illustrated in FIG. 7S.

A nitride layer 110 is next deposited over the structure (e.g. 800 Å), as shown in FIG. 7T. A nitride etch follows, using oxide layer 52 as an etch stop, which leaves nitride blocks 110 over the poly layer 56, as shown in FIG. 7U. Nitride blocks 110 are self aligned to the poly layer 56 by oxide layer 52 (and oxide block 32) and BSG 108. A BSG etch is then used to remove BSG blocks 108 from the third trenches 44. The resulting structure is shown in FIG. 7V.

An anisotropic poly etch is used to remove the exposed portions of poly 56 at the bottom of third trenches 44 (i.e. those portions not protected by nitride 110), as shown in FIG. 7W. Next, nitride is deposited over the structure (e.g. 300 Å thick), followed by an anisotropic nitride etch (e.g. RIE) that removes the deposited nitride except for nitride spacers 112 in third trenches 44. Suitable ion implantation is once again made across the entire surface of the structure to form second regions 50 (buried bit-line drain regions) in the substrate 10 underneath third trenches 44. Outside of third trenches 44, the ions are blocked and have no effect. It should be noted that the ion implantation process could be performed after the oxide etch performed next. The resulting structure is shown in FIG. 7X.

An oxide etch step is next, which removes the exposed portions of oxide layer 52 and oxide layer 48. A metal deposition step is then performed, to deposit a metal such as tungsten, cobalt, titanium, nickel, platinum, or molybdenum over the structure. The structure is then annealed to form a conductive layer of metalized silicon 64 (silicide) in the exposed substrate between oxide spacers 112, and a conductive layer of metalized polysilicon 66 (polycide) on the exposed top portions of poly blocks 42. The metal deposited on the remaining structure is removed by a metal etch process. The resulting structure is shown in FIG. 7Y.

An oxide layer 114 (e.g. BP TEOS), is used to cover the structure. A masking step is performed to define etching areas over the salicide regions 64. The oxide layer 114 is selectively etched in the etching areas to create contact openings that are ideally centered over the salicide regions 64 (and second regions 50). The contact openings are then filled with conductor metal by metal deposition and planarizing etch-back, forming conductor contacts 72. The salicide layer 64 enhances conduction between the conductors 72 and the second regions 50. Polycide layer 66 enhances conduction along the length of poly blocks 42. A bit line connector 74 is added to each active region by metal masking over the oxide 114 to connect together all the contacts 72 in that active region. The final structure is shown in FIG. 7Z.

The formation of contact 72 is referred to as a self aligned contact scheme (SAC) because the width of the contact is made wider than the separation between adjacent, facing nitride spacers 112, and thus is self aligned to the drain region 50. Part of the contact 72 is formed directly over poly block 56, but is insulated therefrom by nitride layer 110, thus ensuring that a good contact with the drain region 50 is achieved.

The self aligned contact scheme (SAC) removes an important constraint on the minimum spacing requirement between adjacent sets of paired memory cells. Specifically, while FIG. 7Z illustrates the contact area (and thus conductors 72) perfectly centered over the drain regions 50, in reality it is very difficult to form the contact openings without some undesirable horizontal shift relative to the drain regions 50. A faulty connection could occur if the horizontal shift becomes great enough to prevent contact 72 from completely filling in the space between spacers 112. With a non-self aligned contact scheme, such as that used with the embodiment illustrated in FIG. 3U, where there is no protective layer of nitride over poly spacers 56, electrical shorts can occur if the contact 72 is shifted over and makes contact with poly spacers 56. To prevent electrical shorts in the non-self aligned contact scheme, the contact openings are formed with edges sufficiently away from the spacers 58 so that even with the maximum possible shift in the contact regions, they will not extend beyond the spacers 58. This of course presents a constraint on the minimum distance between spacers 58 for the embodiment shown in FIG. 3U, in order to provide a sufficient tolerance distance between adjacent sets of paired mirror cells.

SAC as used in the fourth alternate embodiment eliminates this constraint by using a protective layer of material (nitride layer 110) over poly blocks 56. With this protective layer, the contact openings are allowed to be formed in the oxide layer 114 with a sufficient width to ensure there is overlap of the contact opening with the drain regions 50, even if there is a significant horizontal shift of the contact opening during formation. Nitrite layer 110 allows portions of contact 72 to be formed over poly blocks 56 without any shorting therebetween. Thus, the width of contact regions between spacers 72 can be minimized, allowing the scaling down of the overall cell dimension. It should be noted that SAC can be utilized with any of the method embodiments illustrated in this application.

As with the third alternative embodiment, this fourth alternate embodiment results in second regions 50 being formed under only a center portion of the third trench bottom walls, and thus "S" shaped channel regions 76 have three portions joined together at generally right angles: first horizontal portion 80 extending between the third trench 44 and the source region 38, vertical portion 78 extending along the vertical wall of third trench 44, and second horizontal portion 96 extending between the vertical portion 78 and the drain region 50. The generally rectangular control gates 56 each have a first portion directly adjacent the channel region vertical portion 78 and a second portion directly adjacent the channel region second horizontal portion 96. The remaining portion of the nitride layer 30 provides a stronger sidewall fringing field, and hence enhances the capacitance coupling between the source region 38 (including poly block 42) and the floating gate 14. The floating gates 14 have the horizontally oriented edge 54 that directly faces the vertically oriented control gate blocks 56 disposed laterally adjacent thereto. Lastly, the control gate oxide thickness is dictated by a poly deposition step, as opposed to poly deposition and etch back process that can be more difficult to precisely control.

Fifth Alternate Embodiment

Figure 8A:
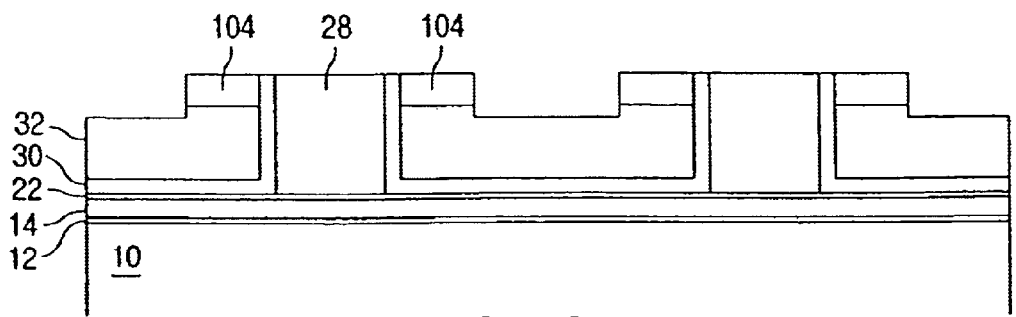
FIGS. 8A–8W are cross sectional views of a semiconductor structure showing in sequence the steps in a fifth alternate processing of the semiconductor structure of FIG. 7F in the formation of a non volatile memory array of floating memory cells of the present invention.
Figure 8B:
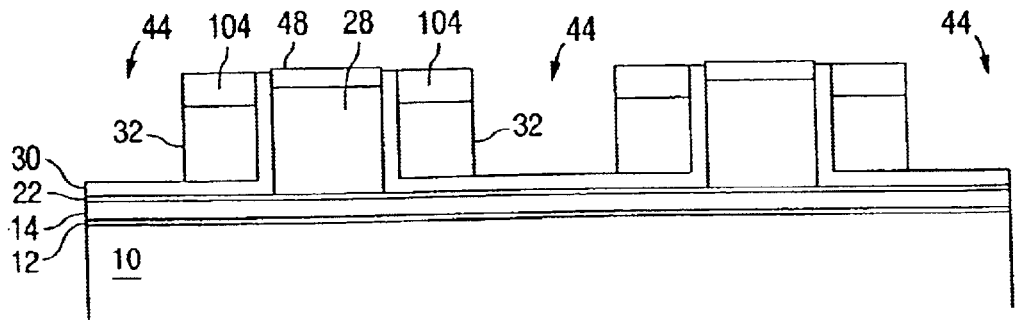
Figure 8C:
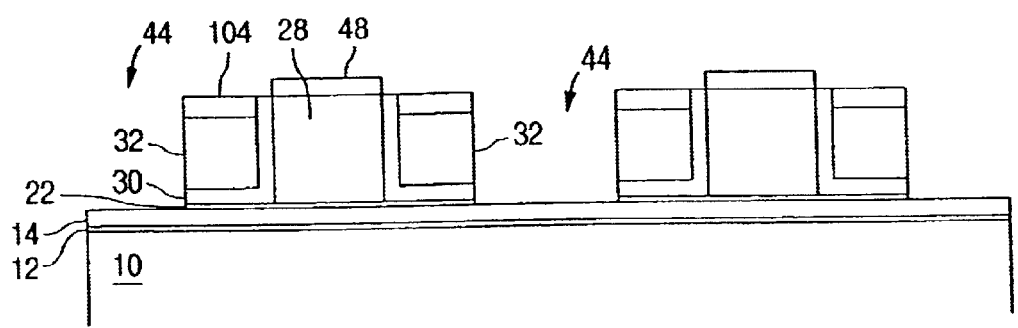
Figure 8D:
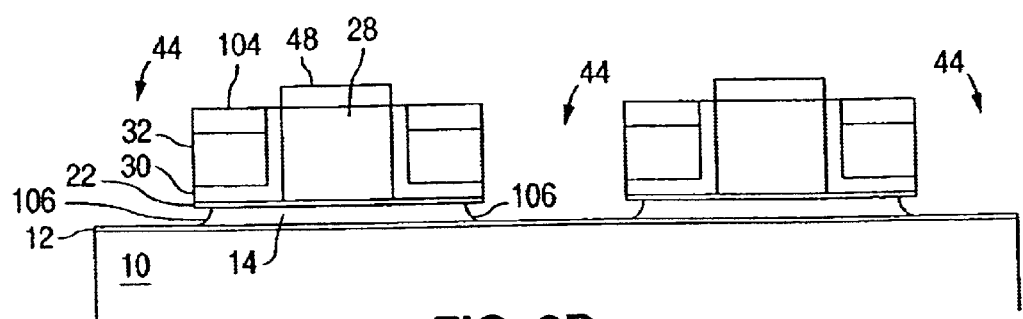
Figure 8E:
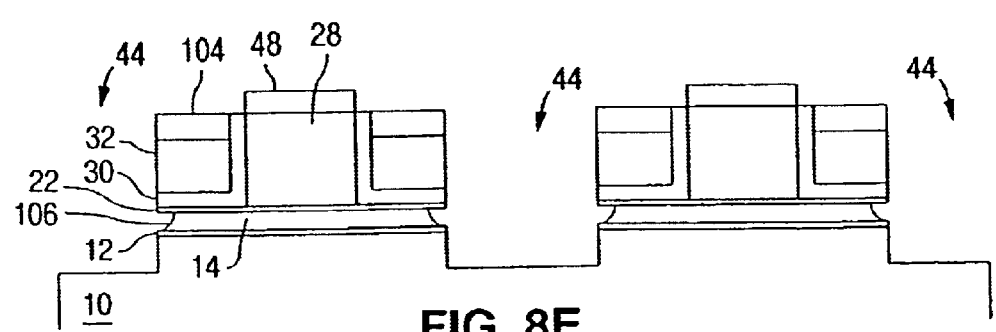
Figure 8F:
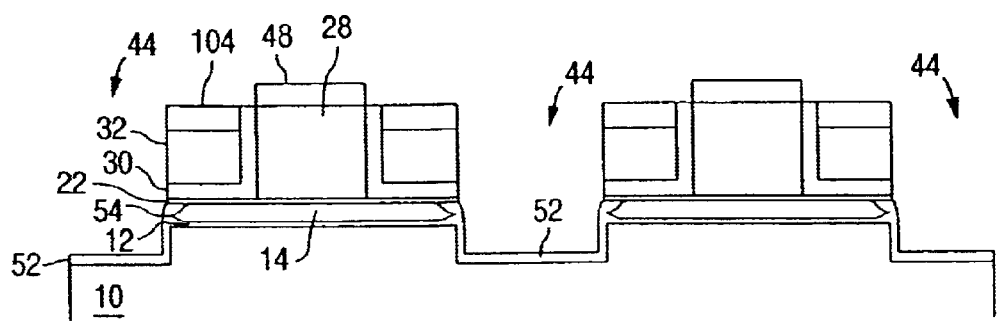
Figure 8G:
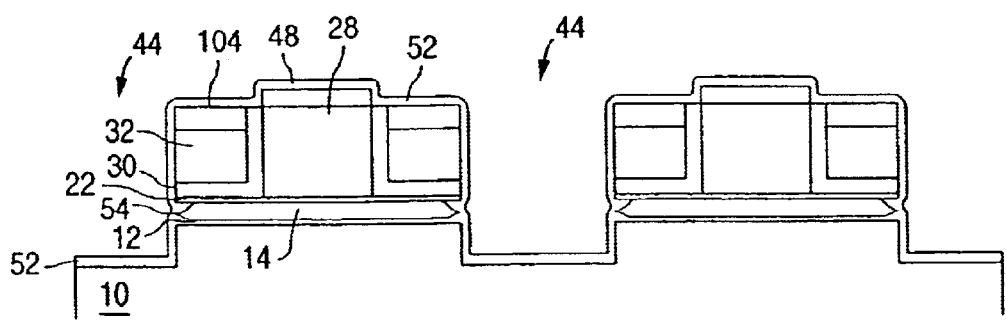
Figure 8H:
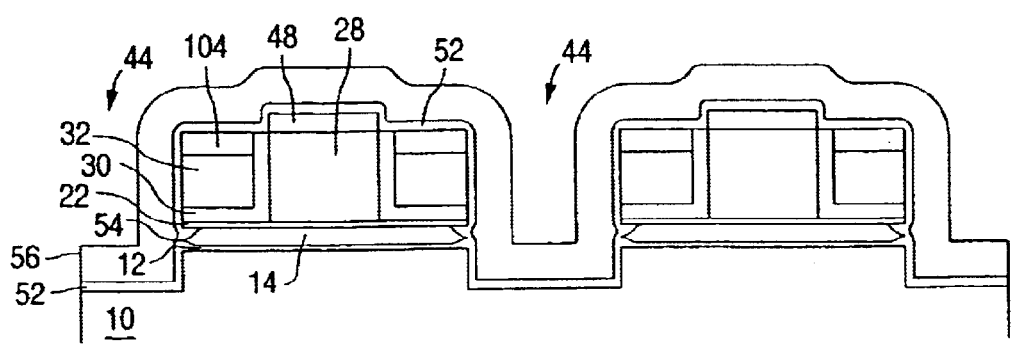
Figure 8I:
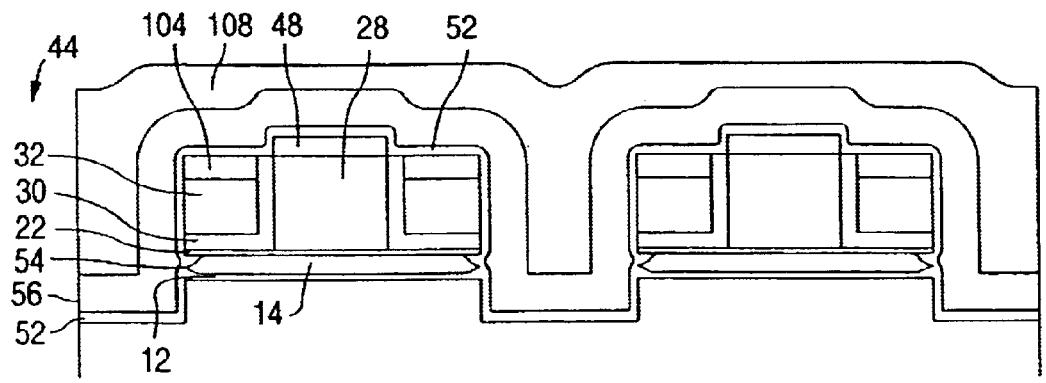
Figure 8J:
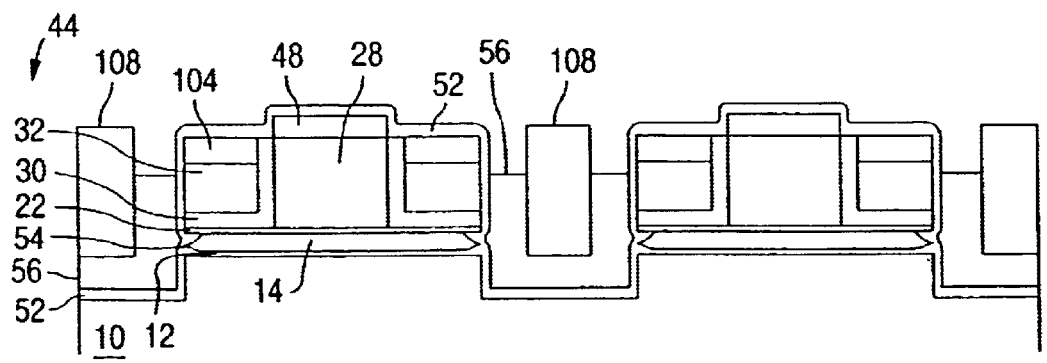
Figure 8K:
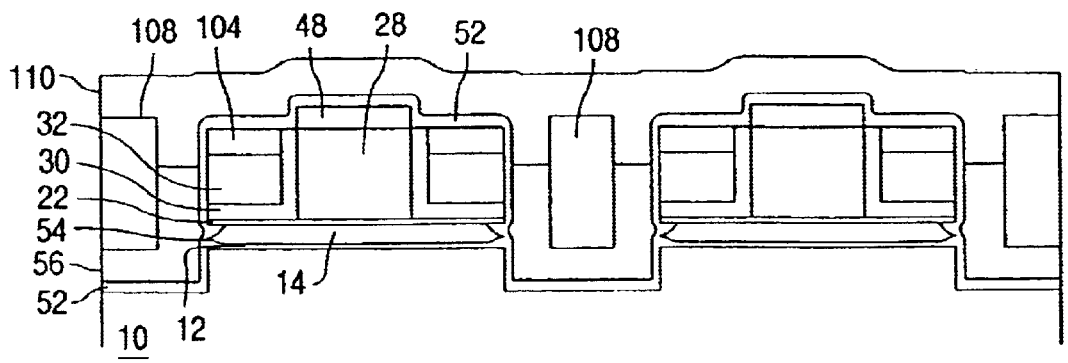
Figure 8L:
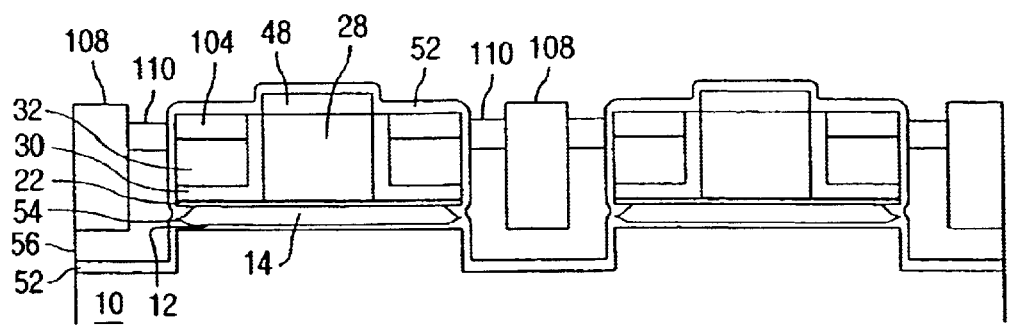
Figure 8M:
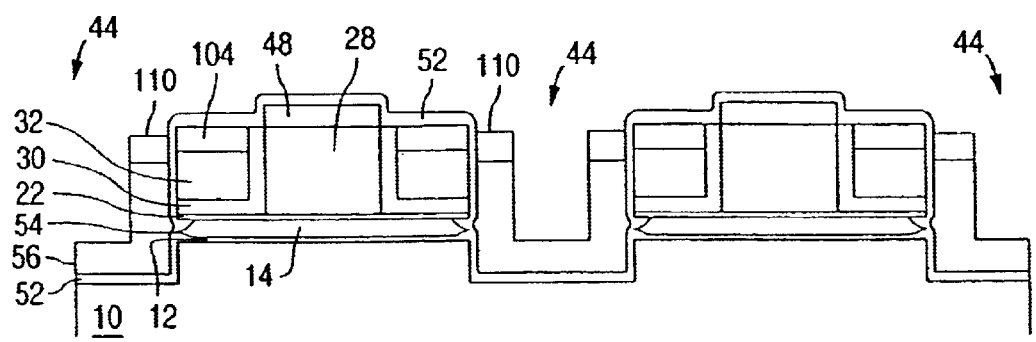
Figure 8N:
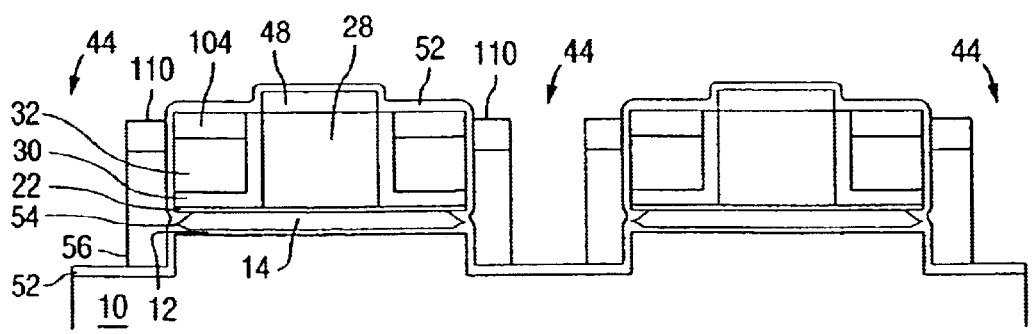
Figure 8O:
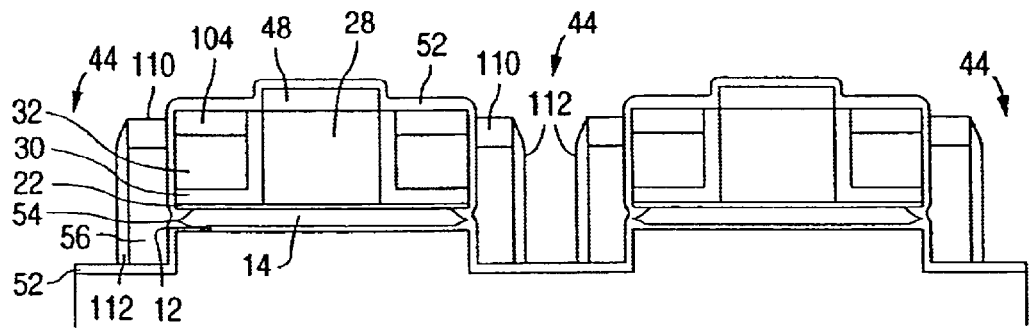
Figure 8P:
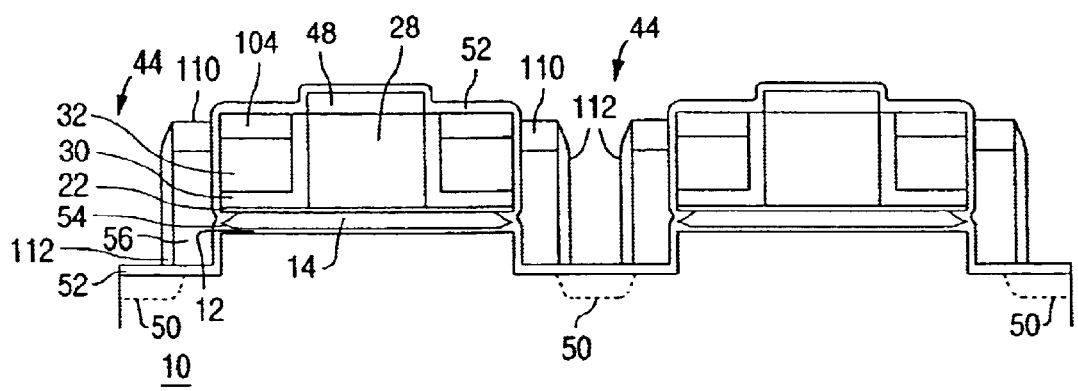
Figure 8Q:
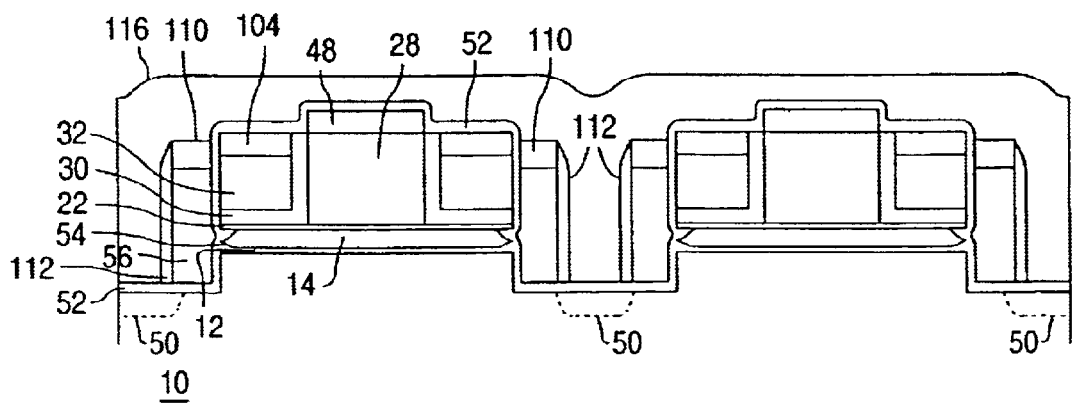
Figure 8R:
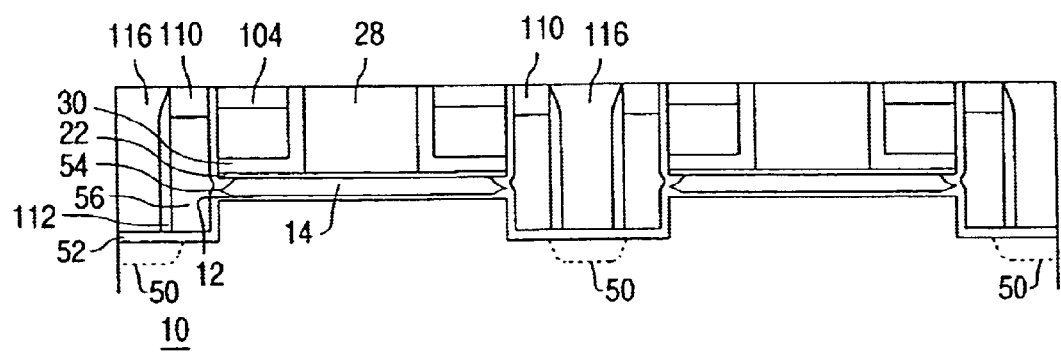
Figure 8S:
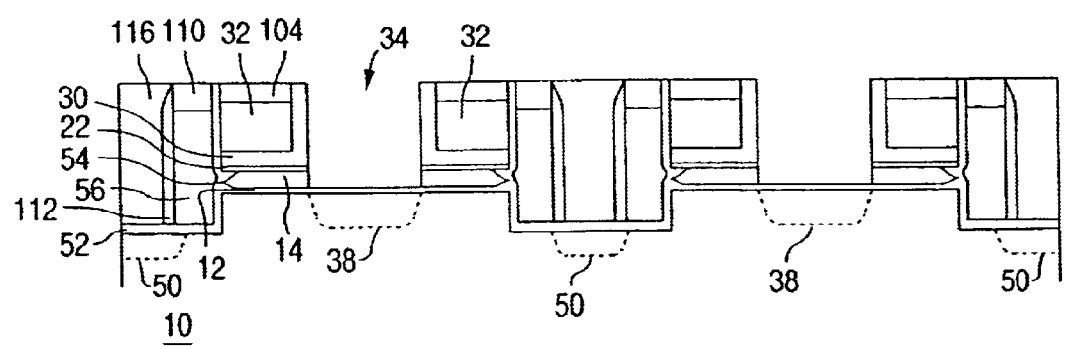
Figure 8T:
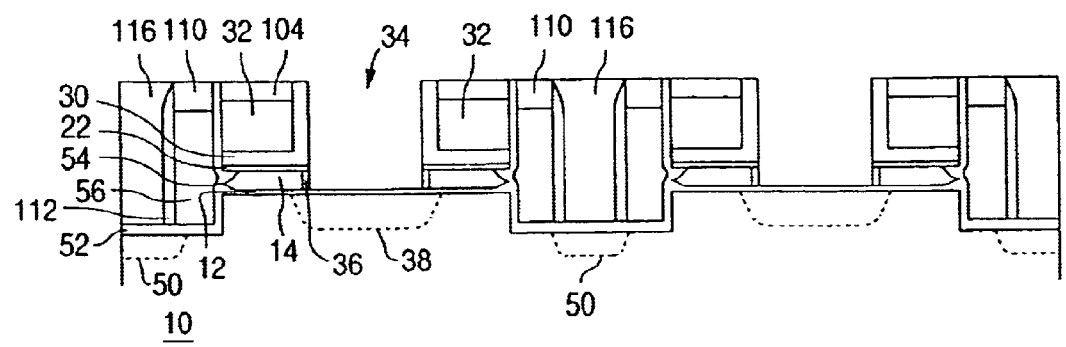
Figure 8U:
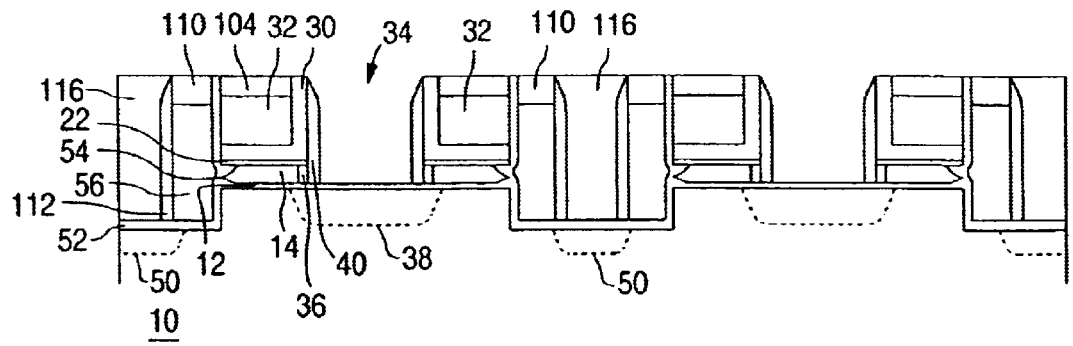
Figure 8V:
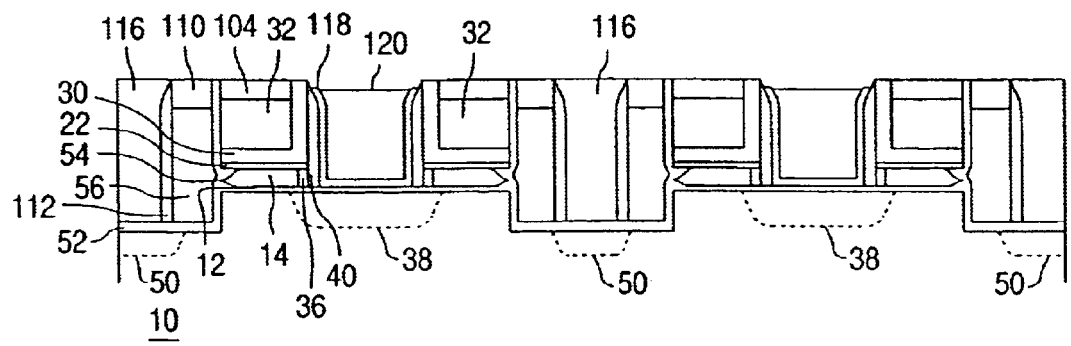
Figure 8W:
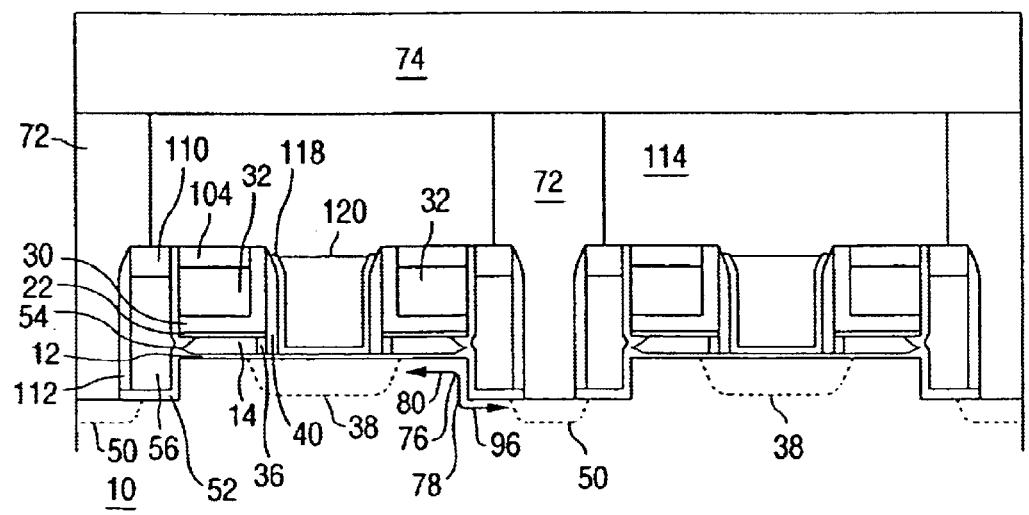

FIGS. 8A to 8W illustrate a fifth alternate process for forming the memory cell structure similar to that illustrated in FIG. 7Z, but with a metal source line scheme. This fifth alternate process begins with the same structure as shown in FIG. 7F.

A BSG etch (e.g. wet etch) is used to remove BSG 102 as shown in FIG. 8A, followed by an anisotropic oxide etch (e.g. RIE) that removes exposed portions of oxide layer 32 (i.e. portions not protected by nitride 104), leaving semi-recessed third trenches 44 disposed between oxide blocks 32. Next, the structure is subjected to a thermal oxidation process, which forms an oxide layer 48 over poly blocks 28. Oxide layer 48 is self aligned to the poly blocks 28 (with a thickness, for example, of ~600 Å). The resulting structure is shown in FIG. 8B.

An anisotropic (dry) nitride etch is used to remove the portions of nitride layer 30 that are exposed in third trenches 44 (between oxide blocks 32), using oxide layer 22 as an etch stop. This nitride etch also removes some of nitride layer 104 (e.g. leaving a thickness of ~500 Å), as well as the exposed portions of nitride layer 30 adjacent poly blocks 28. An anisotropic oxide etch follows to remove the portions of oxide layer 22 that are exposed in third trenches 44 (between oxide blocks 32), using poly layer 14 as an etch stop. This oxide etch also slightly consumes small portions of oxide layer 48. The resulting structure is shown in FIG. 8C.

An anisotropic (dry) poly etch is next performed to remove the portions of poly layer 14 that are exposed in third trenches (between oxide blocks 32), using oxide layer 12 as an etch stop. This poly etch is preferably performed to form a slope or taper region 106 on the edge of poly layer 14 facing third trenches 44, as shown in FIG. 8D.

An anisotropic (dry) oxide etch follows, which removes the portions of oxide layer 12 that are exposed in third trenches 44 (between oxide blocks 32), which exposes the substrate 10 at the bottom of third trenches 44. This oxide etch also slightly consumes small portions of oxide layer 48. With the silicon substrate 10 left exposed at the bottom of third trenches 44, a silicon (dry) etch process is performed to extend third trenches 44 down into substrate 10, to a depth of 500 Å to 1500 Å below the substrate surface. This etch is selected to have a 1-to-1 selectivity between silicon and oxide, so that it also etches a similar depth trench in the oxide isolation regions 16 (LOCOS or STI), wherein third trenches 44 are continuously formed and extend across the active and isolation regions 17/16. The resulting structure is shown in FIG. 8E.

An oxidation process is then performed, which oxidizes the exposed silicon surfaces of third trenches 44 to form a thin layer of oxide 52 (e.g. 150 Å) lining these silicon surfaces. This oxidation process also oxidizes the exposed tapered sides 106 of poly layer 14 that form part of the sidewalls of upper portions of third trenches 44, which results in horizontally oriented edges 54 each of which points directly toward one of the sidewalls of third trenches 44, as illustrated in FIG. 8F. Edges 54 can be elongated edges (i.e. like the sharp edge of a razor blade), or shorter edges (i.e. like the tip of a pencil). This oxidation process also thickens the oxide layer 48 over poly blocks 42.

An optional oxide layer optimization process is next, where the thickness of the thermally grown Fowler-Nordheim tunneling oxide can be optimized by removing oxide layer 52 from the third trenches 44, followed by an HTO oxide deposition step to reform oxide layer 52 over the entire structure having a well controlled thickness (e.g. 150 Å). The resulting structure is shown in FIG. 8G.

A poly layer 56 is formed over the structure (e.g. 800 Å thick), as shown in FIG. 8H. Metalized polysilicon (not shown) can be formed on the upper surface of poly layer 56. A layer of dielectric material 108 (e.g. BSG, ~1000 Å) is then formed over poly layer 56, as shown in FIG. 8I. A BSG etch process is then used to etch BSG 108 down even with oxide layer 52, followed by a poly etch to etch poly layer 56 down even with oxide layer 52. A CMP planarization could alternately be used instead of these BSG and poly etches. An additional poly etch is performed to recess the tops of poly layer 56 below the tops of oxide layer 52 and BSG 108, as illustrated in FIG. 8J.

A nitride layer 110 is next deposited over the structure (e.g. 800 Å), as shown in FIG. 8K. A nitride etch follows, using oxide layer 52 as an etch stop, which leaves nitride blocks 110 over the poly layer 56, as shown in FIG. 8L. Nitride blocks 110 are self aligned to the poly layer 56 by oxide layer 52 (and oxide block 32) and BSG 108. A BSG etch is then used to remove BSG blocks 108 from the third trenches 44. The resulting structure is shown in FIG. 8M.

An anisotropic poly etch is used to remove the exposed portions of poly 56 at the bottom of third trenches 44 (i.e. those portions not protected by nitride 110, as shown in FIG. 8N. Next, nitride is deposited over the structure (e.g. 300 Å thick), followed by an anisotropic nitride etch (e.g. RIE) that removes the deposited nitride except for nitride spacers 112 in third trenches 44, as illustrated in FIG. 8O.

Suitable ion implantation is made across the entire surface of the structure to form second regions 50 (buried bit-line drain regions) in the substrate 10 underneath third trenches 44. Outside of third trenches 44, the ions are blocked and have no effect. It should be noted that this ion implantation process could be performed at an earlier or a later step in the process. The resulting structure is shown in FIG. 8P.

An oxide layer 116 is deposited over the structure, which fills third trenches, as shown in FIG. 8Q. The top surface of the structure is planarized (e.g. CMP process) using nitride layer 110 as an etch stop and exposing poly blocks 28, as shown in FIG. 8R.

A poly etch process is used to remove poly blocks 28 (using oxide layer 22 as an etch stop) to form second trenches 34. A controlled oxide etch (e.g. HF) is used to remove the portions of oxide layer 22 exposed at the bottoms of second trenches 34 (using poly layer 14 as an etch stop). Another poly etch process is performed to remove portions of poly layer 14 exposed at the bottoms of the second trenches 34 (using oxide layer 12 as an etch stop). Suitable ion implantation is then used to form first regions (source regions) 38 in the substrate 10 having a conductivity type (e.g. N type) that is different from that of the surrounding substrate (e.g. P type). The resulting structure is shown in FIG. 8S.

An oxide sidewall layer 36 is formed on the exposed ends of poly layer 14 at trenches 34 using a thermal oxidation process, as shown in FIG. 8T. Sidewall spacers 40 are then formed against the walls of the second trenches 34 by depositing a thin layer of oxide (e.g. 200 Å) over the entire structure, followed by an anisotropic etch process (e.g. RIE dry etch), to remove the deposited oxide layer except for spacers 40. This oxide etch process also removes the exposed portions of oxide layer 12 at the bottom of second trenches 34 to expose the substrate 10, as well as consumes some of oxide layer 52. The resulting structure is shown in FIG. 8U. The second trenches 34 are then filled with blocks 120 of metal material in the following manner. A layer of TiN material 118 is preferably deposited over the structure, followed by the deposition of a thick layer of conductive metal such as aluminum or tungsten. Then, a metal planarization step follows (e.g. CMP), which etches the metal layer down even with the tops of the second trenches 34, leaving blocks 120 of conductive metal in second trenches 34 and in electrical contact with the source regions 38 via TiN 118. An optional metal recess etch can be performed to ensure all the metal deposited outside of second trenches 34 has been removed. The resulting structure is shown in FIG. 8V.

An oxide layer 114 (e.g. BP TEOS), is used to cover the structure. A masking step is performed to define etching areas over the drain regions 50. The oxide layers 114, 116, and 52 are selectively etched from the etching areas to create contact openings that are ideally centered over and significantly wider than the exposed portions of second region 50. The contact openings are then filled with conductor metal by metal deposition and planarizing etch-back, forming conductor contacts 72. A bit line connector 74 is added to each active region by metal masking over the oxide 114 to connect together all the contacts 72 in that active region. The final structure is shown in FIG. 8W.

In addition to the benefits of a horizontally oriented floating gate sharp edge directed toward a vertically oriented control gate, SAC alignment of the metal contacts 72, "S" shaped channel region, and the control gate length being dictated by a poly deposition step, this embodiment has the further advantage of forming a source line 38 with a block of metallic material attached along its length, thus reducing overall resistance of the source line 38 over its length.

It is to be understood that the present invention is not limited to the embodiments described above and illustrated herein, but encompasses any and all variations falling within the scope of the appended claims. For example, third trenches 44 can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate too, which are regions that are doped to have a different conductivity type compared to other portions of the substrate. Lastly, single layers of insulating or conductive material could be formed as multiple layers of such materials, and vice versa.

What is claimed is:

1. A method of operating an electrically programmable and erasable memory device having an electrically conductive floating gate disposed over and insulated from a substrate of semiconductor material, and an electrically conductive control gate having at least a portion thereof disposed laterally adjacent to the floating gate and insulated therefrom by an insulating material, the method comprising the step of:

placing a voltage on the control gate that is sufficiently positive relative to a voltage of the floating gate to induce electrons on the floating gate to laterally tunnel from a horizontally oriented edge extending from a lateral side of the floating gate, through the insulating material, and onto the control gate via Fowler-Nordheim tunneling.

2. The method of claim 1, further comprising the steps of:

placing a positive voltage on a source region of the substrate formed at least partially underneath and insulated from the floating gate to capacitively couple the positive voltage onto the floating gate;

placing a positive voltage on a drain region of the substrate that is disposed underneath a trench formed in the surface of the substrate; and placing a positive voltage on the control gate which has a first portion extending down into the trench and a second portion disposed laterally adjacent to the floating gate edge;

wherein electrons are induced to travel from the drain region, generally along a sidewall of the trench and onto the floating gate.

3. A method of operating an electrically programmable and erasable non-volatile memory cell having a first and a second state, and including an electrically conductive floating gate disposed over and insulated from a substrate of semiconductor material, and an electrically conductive control gate having at least a portion thereof disposed laterally adjacent to the floating gate, the method comprising the steps of:

establishing a first state of the memory cell by injecting electrons from a drain region of the substrate onto the floating gate, wherein the source region is disposed below a surface of the substrate and the injected electrons travel through the substrate in a direction generally perpendicular to the surface of the substrate; and establishing a second state of the memory cell by removing electrons from the floating gate to the control gate via Fowler-Nordheim tunneling through an insulating material disposed therebetween, wherein the removed electrons tunnel from a horizontally oriented edge extending from a lateral side of the floating date, through the insulating material, and onto the control gate in a direction generally parallel to the surface of the substrate.

* * * * *